US008679989B2

(12) United States Patent
Nakashima et al.

(10) Patent No.: US 8,679,989 B2
(45) Date of Patent: Mar. 25, 2014

(54) METHOD OF MANUFACTURING SEMICONDUCTOR DEVICE INCLUDING REMOVAL OF DEPOSITS FROM PROCESS CHAMBER AND SUPPLY PORTION

(75) Inventors: Sadao Nakashima, Toyama (JP); Takahiro Maeda, Toyama (JP); Kiyohiko Maeda, Toyama (JP); Kenji Kameda, Toyama (JP); Yushin Takasawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 434 days.

(21) Appl. No.: 12/224,879

(22) PCT Filed: Mar. 27, 2007

(86) PCT No.: PCT/JP2007/056499
§ 371 (c)(1),
(2), (4) Date: Oct. 24, 2008

(87) PCT Pub. No.: WO2007/116768
PCT Pub. Date: Oct. 18, 2007

(65) Prior Publication Data
US 2009/0305517 A1    Dec. 10, 2009

(30) Foreign Application Priority Data

Mar. 27, 2006    (JP) ................................. 2006-085047

(51) Int. Cl.
*H01L 21/31*    (2006.01)
(52) U.S. Cl.
USPC ............ 438/786; 438/778; 438/791; 118/724
(58) Field of Classification Search
USPC ............................. 438/786, 905, 791; 118/724
See application file for complete search history.

(56) References Cited

U.S. PATENT DOCUMENTS 4,796,562 A * 1/1989 Brors et al. .................... 118/725
5,849,092 A * 12/1998 Xi et al. .......................... 134/1.1
(Continued)

FOREIGN PATENT DOCUMENTS

EP        1 304 731 A1    4/2003
JP        A-2000-068214   3/2000
(Continued)

OTHER PUBLICATIONS

Taiwanese Office Action dated Mar. 30, 2012 for Taiwanese Patent Application No. 96110586 (with translation).

*Primary Examiner* — Kimberly Rizkallah
*Assistant Examiner* — Caleb Henry
(74) *Attorney, Agent, or Firm* — Oliff PLC

(57) ABSTRACT

A method of manufacturing a semiconductor device has: carrying a substrate into a process chamber; depositing a thin film on the substrate by supplying inside the process chamber a first film deposition gas including at least one element among plural elements forming a thin film to be deposited and capable of accumulating a film solely and a second film deposition gas including at least another element among the plural elements and incapable of accumulating a film solely; carrying the substrate on which is deposited the thin film out from inside the process chamber; and removing a first sediment adhering to an interior of the process chamber and a second sediment adhering to an interior of the supply portion and having a chemical composition different from a chemical composition of the first sediment by supplying cleaning gases inside the process chamber and inside a supply portion that supplies the first film deposition gas while changing at least one of a supply flow rate, a concentration, and a type between a cleaning gas to be supplied inside the process chamber and a cleaning gas to be supplied inside the supply portion.

20 Claims, 13 Drawing Sheets

(56) References Cited

U.S. PATENT DOCUMENTS

| | | | |
|---|---|---|---|
| 7,449,246 B2 * | 11/2008 | Kim et al. | 428/451 |
| 2003/0079757 A1 | 5/2003 | Shibata et al. | |
| 2004/0025786 A1 * | 2/2004 | Kontani et al. | 118/715 |
| 2006/0003189 A1 | 1/2006 | Kim et al. | |

FOREIGN PATENT DOCUMENTS

| | | |
|---|---|---|
| JP | A-2000-311860 | 11/2000 |
| JP | A-2002-280376 | 9/2002 |
| JP | A-2005-101361 | 4/2005 |
| JP | A-2005-286005 | 10/2005 |

* cited by examiner

METHOD OF MANUFACTURING SEMICONDUCTOR DEVICE INCLUDING REMOVAL OF DEPOSITS FROM PROCESS CHAMBER AND SUPPLY PORTION

TECHNICAL FIELD

The present invention relates to a method of manufacturing a semiconductor device and a substrate processing apparatus for processing semiconductor wafers, glass substrates and the like.

BACKGROUND ART

As a substrate processing apparatus of this kind, there is an apparatus that supplies a cleaning gas inside a reaction tube from the nozzle to clean inside the reaction tube and the inner wall of the gas nozzle (for example, Patent Documents 1 and 2). There is another apparatus that supplies a cleaning gas from plural film deposition gas nozzles provided inside the reaction tube (for example, Patent Document 2).
Patent Document 1: JP-A-2000-68214
Patent Document 2: JP-A-2005-286005

DISCLOSURE OF THE INVENTION

Problems that the Invention is to Solve

However, in a case where, for example, plural supply portions (gas nozzles) are used so that film deposition gases of different types are supplied to a process chamber (reaction tube) by the corresponding supply portions, the inventors discovered that sediments adhering to the interior of the process chamber and sediments adhering, for example, to the inner walls of the supply portions are of different types, for example, chiefly made of principal components having different chemical compositions. The inventors of the invention also discovered new technical problems in this case that sediments are not removed satisfactorily or the cleaning takes a long time because sediments of different types have to be removed separately, and that in a case where, for example, the supply portions are formed of members thinner than a member forming the process chamber, sediments adhering to the supply portions or exposure to the cleaning gas facilitate deterioration of the supply portions.

An object of the invention is to provide a method of manufacturing a semiconductor device and a substrate processing apparatus capable of solving the technical problems discussed above and therefore capable of suppressing the progress of deterioration of the supply portions owing to the capability of cleaning inside the reaction tube and inside the supply portions satisfactorily in a short time.

Means for Solving the Problems

A first characteristic of the invention is a method of manufacturing a semiconductor device, having: carrying substrates into a process chamber; depositing a thin film on the substrates by supplying inside the process chamber a first film deposition gas including at least one element among plural elements forming a thin film to be deposited and capable of accumulating a film solely and a second film deposition gas including at least another element among the plural elements and incapable of accumulating a film solely;
carrying the substrates on which is deposited the thin film out from inside the process chamber; and supplying cleaning gases inside the process chamber and inside a supply portion that supplies the first film deposition gas while changing at least one of a supply flow rate, a concentration, and a type between a cleaning gas to be supplied inside the process chamber and a cleaning gas to be supplied inside the supply portion for removing a first sediment adhering to an interior of the process chamber and a second sediment adhering to an interior of the supply portion having a chemical composition different from a chemical composition of the first sediment.

A second characteristic of the invention is a method of manufacturing a semiconductor device, having: carrying substrates inside a process chamber; depositing a silicon nitride film on the substrates by supplying a silane-based gas and an ammonia gas inside the process chamber; carrying the substrates on which is deposited the silicon nitride film out from inside the process chamber; and supplying cleaning gases inside the process chamber and inside a supply portion that supplies the silane-based gas while changing at least one of a supply flow rate, a concentration, and a type between a cleaning gas to be supplied to the process chamber and a cleaning gas to be supplied inside the supply portion for removing a first sediment chiefly made of silicon and nitrogen and adhering to an interior of the process chamber and a second sediment chiefly made of silicon and adhering to an interior of the supply portion.

A third characteristic of the invention is a substrate processing apparatus, having: a process chamber in which processing to deposit a thin film on substrates is performed; a heating portion provided on an outside of the process chamber to heat inside the process chamber; a first supply portion disposed in an area opposing the heating portion inside the process chamber at least in part to supply inside the process chamber a first film deposition gas including at least one element among plural elements forming the thin film to be deposited on the substrates and capable of accumulating a film solely; a second supply portion to supply inside the process chamber a second film deposition gas including at least another element among the plural elements and incapable of accumulating a film solely; a third supply portion that supplies a cleaning gas inside the process chamber; an exhaust portion that exhausts atmosphere from inside the process chamber; and a controller that performs control so that cleaning gases are supplied inside the first supply portion and inside the process chamber from the third supply portion while changing at least one of a supply flow rate, a concentration, and a type between a cleaning gas to be supplied inside the first supply portion and a cleaning gas to be supplied inside the process chamber from the third supply portion for removing a first sediment adhering to an interior of the process chamber and a second sediment adhering to an interior of the first supply portion and having a chemical composition different from a chemical composition of the first sediment.

Advantage of the Invention

According to the invention, because at least one of a supply flow rate, a concentration, and a type is changed between a cleaning gas to be supplied inside the process chamber and a cleaning gas to be supplied inside the supply portion, even when sediments of different types adhere to the interior of the process chamber and to the interior of the supply portion, it is possible to clean inside the process chamber and inside the supply portion satisfactorily in a short time. It is therefore possible to provide a method of manufacturing a semiconductor device and a substrate processing apparatus capable of suppressing the progress of deterioration of the supply portion.

DESCRIPTION OF REFERENCE NUMERALS AND SIGNS

Figure 1:
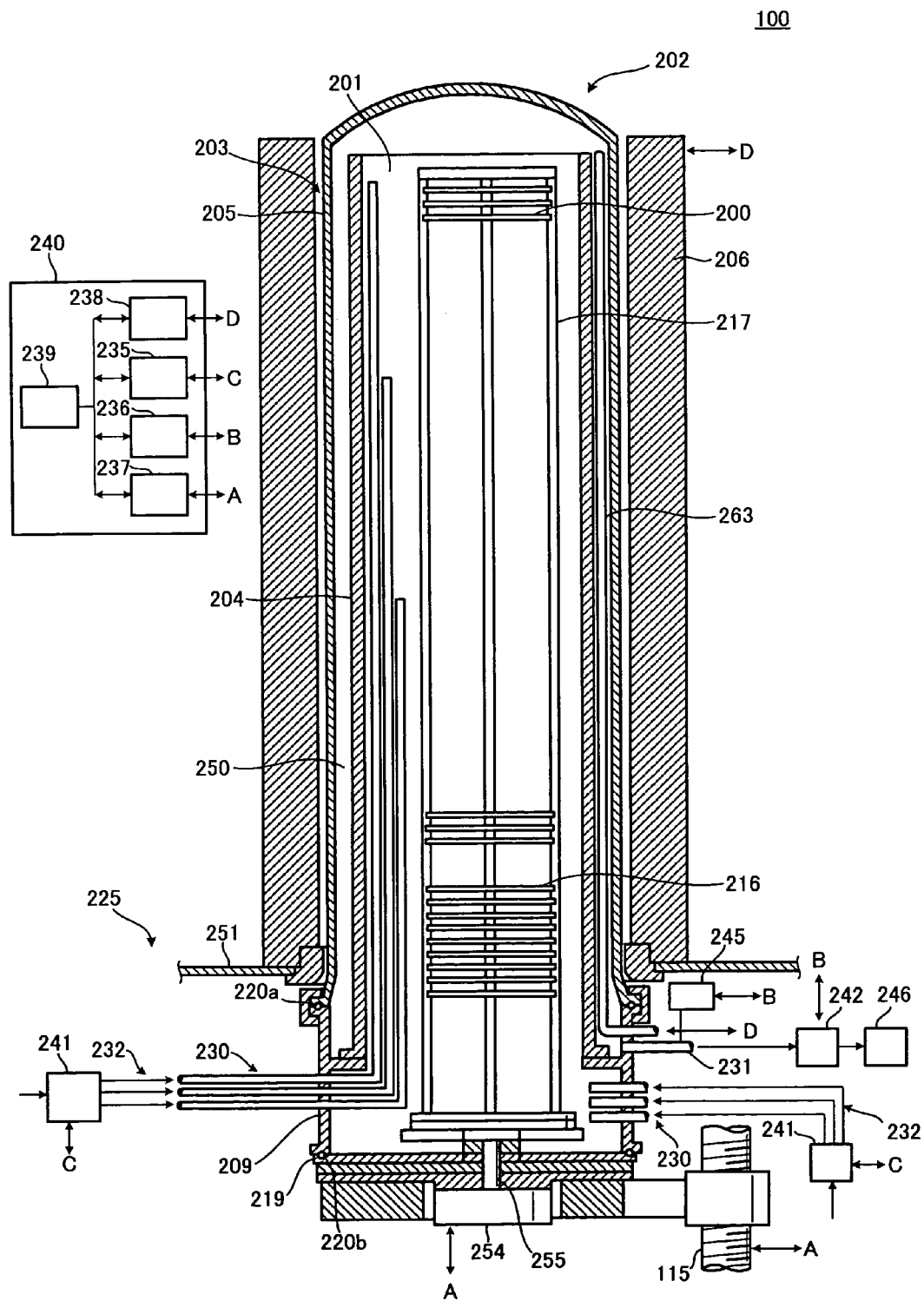
FIG. 1 is a longitudinal cross section schematically showing the configuration of a process furnace in a substrate processing apparatus according to a first embodiment of the invention.

100: substrate processing apparatus
200: wafer
201: process chamber
206: heater
225: gas supply means
230: nozzle
231: exhaust line
270: film deposition gas nozzle
272: gas nozzle
274: film deposition gas supply line
276a: first cleaning gas supply line
276b: second cleaning gas supply line

BEST MODE FOR CARRYING OUT THE INVENTION

First Embodiment

Hereinafter, a first embodiment of the invention will be described on the basis of the drawings.

FIG. 1 is a view schematically showing the configuration of a process furnace 202 in a substrate processing apparatus 100 suitably used in the first embodiment of the invention, which is shown as a longitudinal cross section.

As is shown in FIG. 1, the process furnace 202 has a heater 206 that heats inside a process chamber 201 described below as a heating mechanism (heating portion). The heater 206 is of a cylindrical shape and installed perpendicularly as it is supported on a heater base 251 as a holding plate.

A process tube 203 as a reaction tube is provided concentrically with the heater 206 on the inner side of the heater 206. The process tube 203 is formed of an inner tube 204 as an inner reaction tube and an outer tube 205 as an outer reaction tube provided on the outside of the inner tube 204. The inner tube 204 is made of a heat-resistant material, for example, quartz ($SiO_2$), silicon carbide (SiC), or the like, and is of a cylindrical shape opening at the upper end and the lower end. A process chamber 201 is formed in a cylindrical hollow portion in the inner tube 204 and configured so as to be capable of accommodating wafers 200 as substrates aligned in multiple stages in a vertically direction in a horizontal posture using a boat 217 described below. The outer tube 205 is made of a heat-resistant material, for example, quartz, silicon carbide, or the like and is of a cylindrical shape having the minor diameter larger than the major diameter of the inner tube 204 and closing at the upper end and opening at the lower end. It is provided concentrically with the inner tube 204.

A manifold 209 is provided below the outer tube 205 and concentrically with the outer tube 205. The manifold 209 is made, for example, of stainless or the like, and of a cylindrical shape opening at the upper end and the lower end. The manifold 209 is engaged with the inner tube 204 and the outer tube 205 and is provided so as to support these members. An O-ring 220a as a sealing member is provided between the manifold 209 and the outer tube 205. Owing to the manifold 209 that is supported on the heater base 251, the process tube 203 is in a state where it is installed perpendicularly. The process chamber 203 and the manifold 209 together form a reaction container.

Gas supply means 225 is disposed inside the process chamber 201 in part, and has plural nozzles 230 connected to the manifold 209 to penetrate through the manifold 209 and a gas supply tube 232 connected to the plural nozzles 230. A film deposition gas supply source and an inert gas supply source (described below using FIG. 2) are connected the gas supply tube 232 on the upper stream side, which is opposite to the side where it is connected to the plural nozzles 230, via an MFC (Mass Flow Controller) 241 as a gas flow rate controller. A gas flow rate control portion 235 is electrically connected to the MFC 241, and it is configured in such a manner that the former controls the latter at desired timing for a flow rate of a gas to be supplied to become a desired amount.

The manifold 209 is provided with an exhaust line 231 that exhausts atmosphere inside the process chamber 201. The exhaust line 231 is disposed at the lower end portion of a cylindrical space 250 formed by a clearance defined between the inner tube 204 and the outer tube 205, and communicates with the cylindrical space 250. An evacuation device 246, such as a vacuum pump, is connected to the exhaust line 231 via a pressure sensor 245 as a pressure detector and a pressure adjusting device 242 on the lower stream side which is opposite to the side where it is connected to the manifold 209, and it is configured in such a manner that pressure inside the process chamber 201 can be evacuated so as to be maintained at a predetermined pressure (vacuum). A pressure control portion 236 is electrically connected to the pressure adjusting device 242 and the pressure sensor 245, and it is configured in such a manner that the pressure control portion 236 controls the pressure adjusting device 242 to maintain the pressure inside the process chamber 201 at a desired pressure according to the pressure detected by the pressure sensor 245.

A seal cap 219 as a throat lid capable of hermetically closing the lower end opening of the manifold 209 is provided below the manifold 209. It is configured in such a manner that the seal cap 219 abuts on the lower end of the manifold 209 from below in the vertical direction. The seal cap 219 is made of metal, for example, stainless or the like, and is shaped like a disc. Another O-ring 220b as a sealing member that abuts on the lower end of the manifold 209 is provided on the top surface of the seal cap 219. A rotation mechanism 254 that rotates a boat is provided to the seal cap 219 on the side opposite to the process chamber 201. A rotation shaft 255 of the rotation mechanism 254 penetrates through the seal cap 219 and is connected to a boat 217 described below, and it is configured in such manner that the wafers 200 are rotated by rotating the boat 217. The seal cap 219 is configured so as to be lifted up and down in the vertical direction by a boat elevator 115 as an elevation mechanism provided perpendicularly to the outside of the process tube 203, and this configuration makes it possible to carry the boat 217 in and out from the process chamber 201. A driving control portion 237 is electrically connected to the rotation mechanism 254 and the boat elevator 115 and it is configured in such a manner that the former controls the latter at desired timing to perform desired operations.

The boat 217 as a substrate holding tool is made of a heat-resistant material, for example, quartz, silicon carbide, or the like, and is configured so as to hold plural wafers 200 aligned in multiple stages in a horizontal posture with their centers in agreement with one another. Plural heat insulating plates 216 as a heat insulating member shaped like a disc and made of a heat-resistant material, for example, quartz, silicon carbide, or the like are disposed at the bottom portion of the boat 217 in multiple stages in a horizontal posture and it is configured in such a manner that heat from the heater 206 is hardly transmitted toward the manifold 209.

A temperature sensor 263 as a temperature detector is provided inside the process tube 203. A temperature control portion 238 is electrically connected to the heater 206 and the temperature sensor 263, and it is configured in such a manner that the temperature control portion 238 controls the temperature inside the process chamber 201 at desired timing to become a desired temperature distribution by adjusting the passage of an electric current through the heater 206 according to the temperature information detected by the temperature sensor 263.

The gas flow rate control portion 235, the pressure control portion 236, the driving control portion 237, and the temperature control portion 238 are electrically connected to a main control portion 239 that forms an operation portion and an input and output portion and controls the entire substrate processing apparatus. The gas flow rate control portion 235, the pressure control portion 236, the driving control portion 237, the temperature control portion 238, and the main control portion 239 together form a controller 240.

As one step in the fabrication sequence of the semiconductor device, a method of depositing a thin film on the wafers 200 by means of CVD using the process furnace 202 configured as described above will now be described. In the following description, operations of the respective portions forming the substrate processing apparatus are controlled by the controller 240.

When plural wafers 200 are loaded in the boat 217 (wafer charge), as is shown in FIG. 1, the boat 217 holding the plural wafers 200 is lifted up by the boat elevator 115 and carried into the process chamber 201 (boat loading) (wafer carry-in step). In this state, the seal cap 219 is in a state where it seals the lower end of the manifold 209 via the O-ring 220b.

Inside the process chamber 201 is evacuated by the evacuation device 246 until a desired pressure (vacuum) is achieved. In this instance, the pressure inside the process chamber 201 is measured by the pressure sensor 245 and the pressure adjusting device 242 is under the feedback control according to the pressure thus measured. Also, the process chamber 201 is heated by the heater 206 so that the inside thereof is maintained at a desired temperature. In this instance, the passage of an electric current to the heater 206 is under the feedback control according to the temperature information detected by the temperature sensor 263 so that a desired temperature distribution is maintained inside the process chamber 201. Subsequently, the wafers 200 are rotated as the boat 217 is rotated by the rotation mechanism 254.

Subsequently, a film deposition gas supplied from the film deposition gas supply source and controlled to be at a desired flow rate by the MFC 241 flows through the gas supply tube 232 to be introduced (supplied) inside the process chamber 201 from the nozzles 230. The gas thus introduced goes up inside the process chamber 201, and flows out to the cylindrical space 250 from the upper end opening of the inner tube 204 to be exhausted from the exhaust line 231. The gas comes into contact with the surface of each wafer 200 when passing through inside the process chamber 201. In this instance, a thin film is deposited (accumulated) on the surface of each wafer 200 by a heat CVD reaction (thin film deposition step).

When a preset process time has elapsed, an inert gas is supplied from the inert gas supply source. Hence, not only the interior of the processing chamber 201 is replaced by the inert gas, but also the pressure inside the process chamber 201 is restored to normal pressure.

Thereafter, the seal cap 219 is lifted down by the boat elevator 115. The lower end of the manifold 209 is then opened and the wafers 200 on which is deposited the thin film are carried out from inside the process chamber 201 (boat unloading) through the lower end of the manifold 209 while they are held in the boat 217 (wafer carry-out step). Subsequently, the processed wafers 200 are taken out from the boat 217 (wafer discharge). Also, when the need arises, a cleaning gas is supplied inside the process chamber 201 from the nozzles 230 as will be described below to clean the inner walls of the nozzles 230 and inside the process chamber 201 (cleaning step).

For example, in order to deposit an $Si_3N_4$ film (silicon nitride film), one example of the process conditions when wafers are processed with the process furnace of this embodiment would be as follows: the processing temperature is 400 to 800° C., the process pressure is 1 to 50 Torr (133 to 6665 Pa), a first film deposition gas is an $SiH_2Cl_2$ gas, a second film deposition gas is an $NH_3$ gas, an $SiH_2Cl_2$ gas supply flow rate is 0.02 to 0.30 slm, and an $NH_3$ gas supply flow rate is 0.1 to 2.0 slm. The wafers 200 are processed by maintaining each condition at a given value within the range specified above. In this case, for example, the $SiH_2Cl_2$ gas is supplied from one nozzle provided upstream of the wafer alignment area and plural nozzles having different rising lengths to the wafer alignment area, and the $NH_3$ gas is supplied from another nozzle provided upstream of the wafer alignment area.

Figure 2:
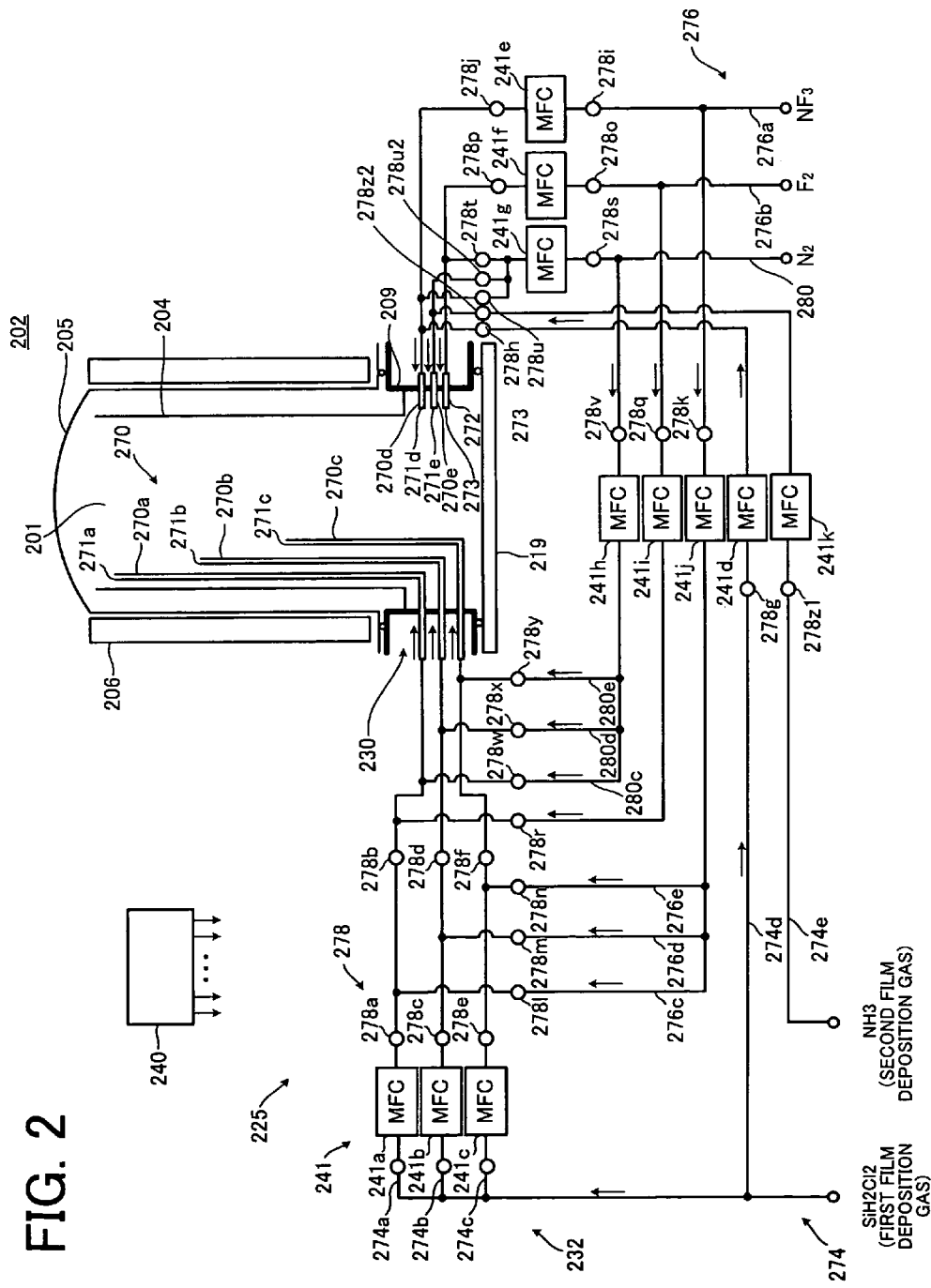
FIG. 2 is a schematic view showing gas supply means in the substrate processing apparatus according to the first embodiment of the invention.

FIG. 2 shows in detail the gas supply means 225 in the substrate processing apparatus 100 of the invention. As has been described, the gas supply means 225 has the nozzles 230 and the gas supply tube 232 connected to the nozzles 230. The nozzles 230 are formed of film deposition gas nozzles 270 for introducing inside the process chamber 201 film deposition gases used to deposit a thin film and a gas nozzle 272 different from the film deposition gas nozzles 270. The film deposition gas nozzles 270 are formed of, for example, three first film deposition gas nozzles 270a, 270b, and 270c shaped like almost a capital L (L-shaped nozzles), for example, one first film deposition gas nozzle 270d shaped like almost a capital I (straight nozzle), and for example, one second film deposition gas nozzle 270e. The gas nozzle 272 is formed, for example, of one nozzle shaped like almost a capital I (straight nozzle).

The gas ports 271a, 271b, and 271c of the first film deposition gas nozzles 270a, 270b, and 270c, respectively, are disposed upward to be displaced in the vertical direction within the wafer alignment area where the wafers 200 are aligned spaced part in multiple stages in a horizontal posture. The gas ports 271d, 271e, and 273 of the first film deposition gas nozzle 270d, the second film deposition gas nozzle 270e, and the gas nozzle 272, respectively, are disposed sideways outside the alignment area of the wafers 200 in the vicinity of the bottom portion of the process chamber 201 upstream of the wafer alignment area. With reference to the lengths of these nozzles, the nozzles 270a, 270b, and 270c are called long nozzles, and the nozzles 270d, 270e, and 272 are called short nozzles.

As has been described, in this embodiment, the gas ports 271d and 271e of the first film deposition gas nozzle 270d and the second film deposition gas nozzle 270e, respectively, are disposed in the vicinity of the bottom portion of the process chamber 201, and the gas ports 271a, 271b, and 271c of the first film deposition gas nozzles 270a, 270b, and 270c are disposed downstream of these gas ports 271d and 271e to be displaced in the vertical direction. Accordingly, for example, in comparison with the case of using the configuration in which a film deposition gas is supplied from the gas ports provided in the vicinity of the bottom portion of the process chamber 201 alone, the film deposition gas can be supplied homogeneously inside the process chamber 201. The film thickness of the thin film deposited on the wafers 200 can be thus made uniform.

For example, in the case of using the configuration in which the film deposition gas is supplied from the gas ports provided in the vicinity of the bottom portion of the process chamber 201 alone, while the film deposition gas is headed upward inside the process chamber 201, which is the lower stream side, from the vicinity of the bottom portion, which is the upper stream side, the film deposition gas undergoes decomposition or generates a by-product gas. The concentration of the film deposition gas therefore becomes lower as the film deposition gas is headed for the lower stream side. In association with the concentration of the film deposition gas that lower as the film deposition gas is headed for the lower stream side, the film thickness of the thin film formed on the wafers 200 varies depending on the positions at which the wafers 200 are disposed, that is, between the lower area, which is the upper stream side, and the upper area, which is the lower stream side.

On the contrary, in this embodiment, by disposing the gas ports 271d and 271e of the first film deposition gas nozzle 270d and the second film deposition gas nozzle 270e, respectively, in the vicinity of the bottom portion of the process chamber 201 as has been described, and by also disposing the gas ports 271a, 271b, and 271c of the first film deposition gas nozzles 270a, 270b, and 270c, respectively, downstream of these gas ports 271d and 271e to be displaced in the top-bottom direction, it is possible to make the concentration of the film deposition gas homogeneous in the top-bottom direction, which makes it difficult for a variance of the film thickness to occur in the thin film formed on each wafer 200.

In this regard, even with the configuration in which the film deposition gas is supplied from the gas ports provided in the vicinity of the bottom portion of the process chamber 201 alone, a drop in concentration of the film deposition gas can be compensated for by the temperature, that is, the decomposition rate of the film deposition gas, by providing a temperature gradient inside the process chamber 201. More specifically, by raising the temperature inside the process chamber 201 from bottom to top in accordance with the concentration of the first film deposition gas that becomes lower from bottom, which is the upper stream side, to top, which is the lower stream side, it is possible to make the film thickness of the film deposited on the wafers 200 uniform in the top-bottom direction. Adjusting the film thickness by providing the temperature gradient within the process chamber 201 in this manner is a typical film thickness adjusting method in the related art regarding the deposition of a film, such as an $Si_3N_4$ film.

By adjusting the temperature distribution inside the process chamber 201, the uniformity of the film thickness among plural wafers 200 can be enhanced. However, because the heating temperature varies with a position in the top-bottom direction inside the process chamber 201, the film quality of the thin film varies with the positions in the top-bottom direction at which the wafers 200 are disposed. This gives rise to a variance in the physical property of the thin film, for example, the refraction index or the etching rate of the thin films. Although this phenomenon has been negligible in the past, it becomes problematic as miniaturization proceeds.

Under these circumstances, in this embodiment, the film quality is made homogeneous among the plural wafers 200 by depositing films without providing the temperature gradient in the top-bottom direction inside the process chamber 201. Also, at the same time, the film thickness of the thin film is made uniform among the plural wafers 200 by maintaining the concentration of the film deposition gas homogeneous in the top-bottom direction by not only disposing the gas ports 271d and 271e in the vicinity of the bottom portion of the process chamber 201, but also disposing the gas ports 271a, 271b, and 271c downstream of these gas ports 271d and 271e so as to be displaced in the top-bottom direction as has been described above.

As has been described, in addition to the configuration to dispose the gas ports 271d and 271e of the first film deposition gas nozzle 270d and the second film deposition gas nozzle 270e, respectively, in the vicinity of the bottom portion of the process chamber 201, by disposing the gas ports 271a, 271b, and 271c of the first film deposition gas nozzles 270a, 270b, and 270c, respectively, so as to be displaced in the top-bottom direction within the wafer alignment area, the film thickness and the film quality of the thin film deposited on the wafers 200 can be uniform and homogeneous. However, there is a need to dispose the first film deposition gas nozzles 270a, 270b, and 270c at positions opposing the heater 206. Hence, the first film deposition gas nozzles 270a, 270b, and 270c are heated by the heater 206 as in the same manner as the reaction tube 203. Part of the first film deposition gas therefore undergoes heat decomposition inside the first film deposition gas nozzles 270a, 270b, and 270c, and sediments may possibly adhere to the interiors of the first film deposition gas nozzles 270a, 270b, and 270c due to a heat CVD reaction.

When sediments are accumulated and adhere to the interiors of the first film deposition gas nozzles 270a, 270b, and 270c, the adhering sediments undergo cracking or they further undergo separation. Hence, there is a risk of a harmful effect, such as foreign matter is blown onto the wafers 200 during film deposition.

Sediments adhering to the interiors of the first film deposition gas nozzles 270a, 270b, and 270c will now be described. For example, in a case where $SiH_4$ is used as the first film deposition gas in order to deposit a silicon (Si) thin film of an amorphous or polycrystalline structure, $SiH_4$ is heated inside the first film deposition gas nozzles 270a, 270b, and 270c and undergoes heat decomposition. An Si thin film is therefore adheres to the interiors of the first film deposition gas nozzles 270a, 270b, and 270c as sediments due to a heat CVD reaction. The sediments formed of the Si thin film have a chemical composition same as that of sediments adhering to the interior of the process chamber 201. Hence, it is sufficient to take into account that the sediments of one type that adhere commonly to the interior of the process chamber 201 and the interiors of the first film deposition gases 270a, 270b, and 270c are removed in the sediment removal step.

In contrast to this case, in a case where a thin film of $Si_3N_4$ (silicon nitride) is to be deposited, because a mixed gas of $SiCl_2H_2$ as the first film deposition gas and $NH_3$ as the second film deposition gas flows inside the process chamber 201, the sediments adhering to the interior of the process chamber 201 are chiefly an $Si_3N_4$ film generated by a heat CVD reaction of these gases. Meanwhile, regarding the sediments adhering to the first film deposition gas nozzles 270a, 270b, and 270c, because solely $SiCl_2H_2$ as the first film deposition gas flows inside the first film deposition gas nozzles 270a, 270b, and 270c, an Si thin film adheres as the sediments in association with a heat CVD reaction of $SiCl_2H_2$ inside the first film deposition gas nozzles 270a, 270b, and 270c. As has been described, sediments of different types, that is, having different chemical compositions, adhere to the interior of the processing chamber 201 and to the interiors of the first film deposition gas nozzles 270a, 270b, and 270c. Accordingly, in order to remove the sediments, it is necessary to take into account that the sediments of these two types having different chemical compositions are removed.

In a case where a cleaning gas is supplied inside the first film deposition gas nozzles 270a, 270b, and 270c in order to remove the sediments adhering to the interiors of the first film deposition gas nozzles 270a, 270b, and 270c, for example, even when the first film deposition gas nozzles 270a, 270b, and 270c are quarts members as the reaction tube 203, because the first film deposition gas nozzles 270a, 270b, and 270c are thinner than the reaction tube 203, they are susceptible to corrosive damage when exposed to the cleaning gas and therefore readily deteriorate. Hence, in a case where the sediments adhering to the interiors of the first film deposition gas nozzles 270a, 270b, and 270c are cleaned using the cleaning gas, there is a problem that the first film deposition gas nozzles 270a, 270b, and 270c are fragile.

Under these circumstances, in this embodiment, even in a case where the types, that is, the chemical compositions of the sediments adhering to the interiors of the first film deposition gas nozzles 270a, 270b, and 270c and to the interior of the process chamber 201 are different, a unique devisal is made in the configuration of the gas supply means 225 (gas supply tube 232) and a unique devisal is made as well in the method of cleaning inside the first film deposition gas nozzles 270a, 270b, and 270c and inside the process chamber 201 performed by supplying the cleaning gas using the gas supply means 225 (gas supply tube 232), so that not only can the adhering materials adhering to the interiors of the first film deposition nozzles 270a, 270b, and 270c and to the interior of the process chamber 201 be removed in a satisfactory manner, but also the first film deposition gas nozzles 270a, 270b, and 270c can resist breaking. Hereinafter, of the gas supply means 225, the concrete configuration of the gas supply tube 232 and the concrete cleaning method using the gas supply tube 232 will be described.

Cleaning conditions are set according to the types of sediments to be removed for the gas supply tube 232 whose concrete configuration will be described below and the cleaning method using this gas supply tube 232. To be more concrete, the supply flow rate of the cleaning gas, the concentration of the cleaning gas, the type of the cleaning gas, and so forth are determined according to the type of the sediments. For example, the type of the cleaning gas is selected by taking the reactive compatibility with the sediments into account. Also, by taking a difference of the etching rates between the two types of sediments into account, the cleaning gas is diluted with an inert gas when the need arises. A concrete description will be given below.

As is shown in FIG. 2, the gas supply tube 232 is formed of a film deposition gas supply line 274, a cleaning gas supply line 276, and an inert gas supply line 280. The film deposition gas supply line 274 is connected to the supply source of the film deposition gas on the upper stream side and to the mass flow controller (MFC) 241 as well as to the plural film deposition gas nozzles 270 via plural air valves 278 on the lower stream side.

To be more concrete, a first film deposition gas supply line 274a is connected to the supply source of the first film deposition gas (for example, $SiH_2Cl_2$) on the upper stream side and to an MFC 241a as well as to the first film deposition gas nozzle 270a via an air valve 278a and an air valve 278b on the lower stream side.

Also, a first film deposition gas supply line 274b is connected to the supply source of the first film deposition gas (for example, $SiH_2Cl_2$) on the upper stream side and to an MFC 241b as well as to the first film deposition gas nozzle 270b via an air valve 278c and an air valve 278d on the lower stream side.

A first film deposition gas supply line 274c is connected to the supply source of the first film deposition gas (for example, $SiH_2Cl_2$) on the upper stream side and to an MFC 241c as well as to the first film deposition gas nozzle 270c via an air valve 278e and an air valve 278f on the lower stream side.

Further, a first film deposition gas supply line 274d is connected to the supply source of the first film deposition gas (for example, $SiH_2Cl_2$) on the upper stream side and to an MFC 241d as well as to the first film deposition gas nozzle 270d via an air valve 278g and an air valve 278h on the lower stream side.

Also, a second film deposition gas supply line 274e is connected to the supply source of the second film deposition gas (for example, $NH_3$) on the upper stream side and to an MFC 241k as well as to the second film deposition gas nozzle 270e via an air valve 278z1 and an air valve 278z2 on the lower stream side. In this manner, the film deposition gas supply line 274 is configured so as to supply the first film deposition gas (for example, $SiH_2Cl_2$) inside the process chamber 201 from the plural first film deposition gas nozzles 270a, 270b, 270c, and 270d, and to supply the second film deposition gas (for example, $NH_3$) inside the process chamber 201 from the single second film deposition gas nozzle 270e.

The cleaning gas supply line 276 is formed of a first cleaning gas supply line 276a and a second cleaning gas supply line 276b. It is connected to the supply source of the cleaning gas on the upper stream side and connected to the mass flow controller (MFC) 241 as well as to the nozzles 230 or the like via plural air valves 278 on the lower stream side.

To be more concrete, the first cleaning gas supply line 276a is connected to the supply source of, for example, $NF_3$, as a first cleaning gas, on the upper stream side, and connected to the first film deposition gas nozzle 270d via air valves 278i and 278j and an MFC 241e at one end on the lower stream side. Also, it is connected to the first film deposition gas supply lines 274a, 274b, and 274c via air valves 278k, 278l, 278m, and 278n and an MFC 241j at the other end on the lower stream side.

The second cleaning gas supply line 276b is connected to the supply source of, for example, $F_2$ as a second cleaning gas, on the upper stream side. It is also connected to the gas nozzle 272 via air valves 278o and 278p and an MFC 241f at one end on the lower stream side and connected to the first film deposition gas supply line 274a or the first film deposition gas nozzle 270a via air valves 278p and 278r and an MFC 241i at the other end on the lower stream side.

The other end on the lower stream side of the second cleaning gas supply line 276b may be connected to the first film deposition gas supply line 274b or the first film deposition gas nozzle 270b, or it may be connected to the first film deposition gas supply line 274c or the first film deposition gas nozzle 270c. Also, the other end on the lower stream side of the second cleaning gas supply line 276b may be connected to all of the three first film deposition gas supply lines 274a, 274b, and 274c, or to all the three first film deposition gas nozzles 270a, 270b, and 270c.

Instead of nitrogen trifluoride ($NF_3$) and fluorine ($F_2$), for example, chlorine trifluoride ($ClF_3$), a mixed gas ($F_2+HF$) of fluorine ($F_2$) and hydrogen fluoride (HF), and a mixed gas of these gases of four types and nitrogen ($N_2$) may be used as the cleaning gas.

The inert gas supply line 280 is connected to the supply source of an inert gas (for example, $N_2$) on the upper stream side. It is also connected to the second cleaning gas supply line 276b, the second film deposition gas supply line 274e, and the first cleaning gas supply line 276a via air valves 278s, 278t, 278u2, and 278u and an MFC 241g at one end on the lower stream side and connected to the plural first film deposition gas supply lines 274a, 274b, and 274c via air valves 278v, 278w, 278x, and 278y, and an MFC 241h at the other end on the lower stream side.

Figure 3:
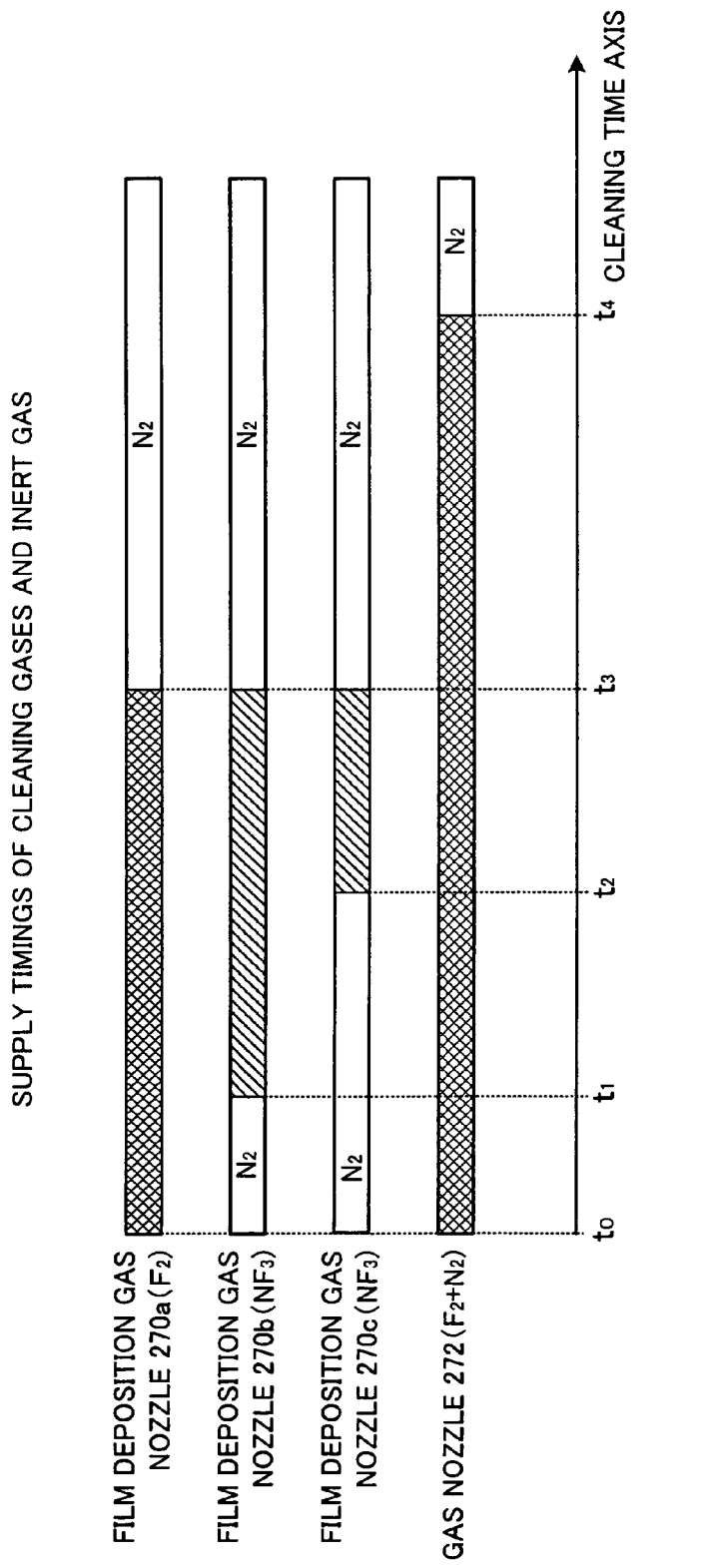
FIG. 3 is a timing chart showing supply timings of cleaning gases and an inert gas by the gas supply means in the substrate processing apparatus according to the first embodiment of the invention.

An example of the method of supplying the cleaning gas in the cleaning step described above will now be described on the basis of FIGS. 2 and 3.

Because of the thin film deposition step described above, different materials are accumulated on the inner walls of the film deposition gas nozzles 270 and inside the process chamber 201. For example, an Si film is accumulated on the inner walls of the film deposition gas nozzles 270 whereas an $Si_3N_4$ film is accumulated inside the process chamber 201.

To be more concrete, in a case where $SiH_2Cl_2$ is supplied as the first film deposition gas from the first film deposition gas nozzles 270a, 270b, 270c, and 270d and $NH_3$ is supplied as the second film deposition gas from the second film deposition gas nozzle 270e, of the film deposition gas nozzles 270, an Si film is accumulated inside the first film deposition gas nozzles 270a, 270b, and 270c disposed in an area opposing the heater 206, whereas an $Si_3N_4$ film is accumulated inside the process chamber 201. It should be noted that $SiH_2Cl_2$ is also supplied from the first film deposition gas nozzle 270d. However, because the first film deposition gas nozzle 270d is not at a position opposing the heater 206, $SiH_2Cl_2$ does not undergo decomposition inside the first film deposition gas nozzle 270d. The Si film is therefore not accumulated inside the first film deposition gas nozzle 270d.

In addition, because $NH_3$ is supplied from the second film deposition gas nozzle 270e, $SiH_2Cl_2$ will not flow inside the second film deposition gas nozzle 270e. Should $SiH_2Cl_2$ enter into the second film deposition gas nozzle 270e, because the second film deposition gas nozzle 270e is not at a position opposing the heater 206, the film will not be accumulated inside the second film deposition gas nozzle 270e.

Also, because the area of the inner wall of the process chamber 201 is larger than the area of the inner walls of the film deposition gas nozzles 270, an amount of sediments adhering to the inner wall of the process chamber 201 is larger than an amount of sediments adhering to the inner walls of the gas nozzles 270. In addition, because an amount of sediments adhering to the inner walls of the first film deposition gas nozzles 270a, 270b, and 270c becomes larger as the nozzle becomes longer, an amount of sediments is the largest in the first film deposition gas nozzle 270a followed by the second film deposition gas nozzle 270b, and an amount of sediment is the smallest in the third film deposition gas nozzle 270c. Further, on the inner walls of the first film deposition gas nozzles 270a, 270b, and 270c, an amount of sediments adhering to the inner walls becomes larger on the upper stream side of the nozzles. Hereinafter, an example of the method of supplying the cleaning gases when the Si film is accumulated inside the first film deposition gas nozzles 270a, 270b, and 270c and the $Si_3N_4$ film is accumulated inside the process chamber 201 will be described with reference to FIG. 2 and FIG. 3.

Initially (at the time axis t0 of FIG. 3), the controller 240 starts to supply the second cleaning gas inside the process chamber 201 from the first film deposition gas nozzle 270a and the gas nozzle 272.

To be more concrete, on the one hand, the controller 240 opens the air valve 278q and the air valve 278r provided to the second cleaning gas supply line 276b, and adjusts a flow rate by means of the MFC 241i so that a supply flow rate of the second cleaning gas becomes, for example, about 2 slm. In short, the controller 240 supplies $F_2$ as the second cleaning gas, which is adjusted to be at a specific flow rate, inside the process chamber 201 via the first film deposition gas nozzle 270a. Consequently, the Si film accumulated on the inner wall of the first film deposition gas nozzle 270a is removed by $F_2$.

Alternatively, a mixed gas of $F_2$ and $N_2$ ($F_2+N_2$) as the second cleaning gas adjusted to be at a specific flow rate may be supplied inside the process chamber 201 via the film deposition gas nozzle 270a by opening the air valve 278v and the air valve 278w of the inert gas supply line 280.

On the other hand, the controller 240 opens the air valves 278o and 278p provided to the second cleaning gas supply line 276b, and adjusts a flow rate by means of the MFC 241f so that a supply flow rate of the second cleaning gas becomes, for example, about 2 slm. Also, it opens the air valve 278s and the air valve 278t of the inert gas supply line 280, and adjusts a flow rate by means of the MFC 241g so that a supply flow rate of the inert gas becomes, for example, about 2 slm. In short, the controller 240 supplies, as the second cleaning gas, a mixed gas of $F_2$ and $N_2$ ($F_2+N_2$), which is adjusted to be at a specific flow rate, inside the process chamber 201 via the gas nozzle 272. Consequently, the $Si_3N_4$ film accumulated inside the process chamber 201 is removed by the mixed gas ($F_2+N_2$)

In this instance, the controller 240 supplies $N_2$ inside the first film deposition gas nozzles 270b and 270c by opening the air valve 278v, the air valves 278x and 278y.

It should be noted that the controller 240 constantly supplies $N_2$ inside the film deposition gas nozzles 270d and 270e during the cleaning by opening the air valves 278s, 278u, and 278u2. It is thus possible to prevent the first and second cleaning gases from entering into the gas nozzles 270d and 270e. As has been described, no sediments adhere to the interiors of the film deposition gas nozzles 270d and 270e. Hence, there is no need to flow the cleaning gas inside the film deposition gas nozzles 270d and 270e.

Subsequently, after a predetermined time has elapsed (at the time axis t1 of FIG. 3), the controller 240 starts to supply the first cleaning gas inside the process chamber 201 from the first film deposition gas nozzle 270b. To be more concrete, the controller 240 opens the air valves 278k and 278m provided to the first cleaning gas supply line 276a and the air valve 278d provided to the first film deposition gas supply line 274b, and adjusts a flow rate by means of the MFC 241j so that a supply flow rate of the first cleaning gas becomes, for example, 0.5 slm. In short, the controller 240 supplies $NF_3$ as the first cleaning gas, which is adjusted to be at a specific flow rate, inside the process chamber 201 via the first film deposition gas nozzle 270b. Consequently, the Si film accumulated on the inner wall of the first film deposition gas nozzle 270b is removed by $NF_3$. In this instance, the controller 240 stops supplying $N_2$ to the first film deposition gas nozzle 270b while it continues to supply $N_2$ to the first film deposition gas nozzle 270c.

After a predetermined time has elapsed further (at the time axis t2 of FIG. 3), the controller 240 starts to supply the first cleaning gas inside the process chamber 201 from the first film deposition nozzle 270c. To be more concrete, the controller 240 opens the air valve 278n provided to the first cleaning gas supply 276a and the air valve 278f provided to the first film deposition gas supply line 274c, and supplies $NF_3$ as the first cleaning gas, which is adjusted to be at a specific flow rate, inside the process chamber 201 via the first film deposition gas nozzle 270c. Consequently, the Si film accumulated on the inner wall of the first film deposition gas nozzle 270c is removed by $NF_3$.

After a predetermined time has elapsed further (at the time axis t3 of FIG. 3), the controller 240 starts to supply an inert gas inside the process chamber 201 from the first film deposition gas nozzles 270a, 270b, and 270c. To be more concrete, the controller 240 closes the air valve 278k provided to the first cleaning gas supply line 276a, opens the air valve 278x and the air valve 278y provided to the inert gas supply line 280, closes the air valve 278q provided to the second cleaning gas supply line 276b, and opens the air valve 278w provided to the inert gas supply line 280. In short, the controller 240 supplies $N_2$ alone, which is adjusted to be at a specific flow rate, inside the process chamber 201 via the first film deposition gas nozzles 270a, 270b, and 270c. It is thus possible to prevent over-etching of the first film deposition gas nozzles 270a, 270b, and 270c caused by residual $F_2$ and $NF_3$ gases.

After a predetermined time has elapsed further (at the time axis t4 of FIG. 3), the controller 240 starts to supply an inert gas inside the process chamber 201 from the gas nozzle 272. To be more concrete, the controller 240 supplies $N_2$ alone, which is adjusted to be at a specific flow rate, inside the process chamber 201 via the gas nozzle 272 by closing the air valve 278o provided to the second cleaning gas supply line 276b.

As has been described, in this embodiment, the gas supply means 225 is configured so as to supply plural cleaning gases from the plural film deposition gas nozzles 270. For example, it is configured in such a manner that $F_2$ as the second cleaning gas can be also supplied from at least one first film deposition gas nozzle among the first film deposition gas nozzles 270a through 270d capable of supplying $NF_3$ as the first cleaning gas.

Also, as has been described, in this embodiment, by configuring in such a manner that the gas supply means 225 changes the types of gas between the cleaning gas to be supplied inside the process chamber 201 via the gas nozzle 272 where an amount of adhering sediments is large and the cleaning gas to be supplied inside the first film deposition gas nozzles 270b and 270c where an amount of adhering sediments is small, it is possible to make it difficult for deterioration caused by over-etching to occur in the first film deposition gas nozzles 270b and 270c while removing the sediments inside the process chamber 201 and inside the first film deposition gas nozzles 270a, 270b, and 270c in a satisfactory manner.

Also, as has been described, in this embodiment, by changing the types of gas between the cleaning gas to be supplied inside the first film deposition gas nozzle 270a where an amount of adhering sediments is the largest among the first film deposition gas nozzles 270a, 270b, and 270c and the cleaning gas to be supplied inside the other film deposition gas nozzles 270b and 270c, it is possible to make it difficult for deterioration caused by over-etching to occur in the first film deposition gas nozzles 270b and 270c while removing the sediments adhering to the inner walls of the first film deposition gas nozzles 270a, 270b, and 270c in a satisfactory manner.

Further, as has been described, in this embodiment, the gas supply means 225 determines a time over which to supply the cleaning gas to the plural film deposition gas nozzles 270 according to amounts of sediments accumulated in the respective film deposition gas nozzles 270. More specifically, a time over which to supply the cleaning gas inside the first film deposition gas nozzle 270a where an amount of sediments accumulated therein is the largest among the first film deposition gas nozzles 270a, 270b, and 270c is set to be the longest. A time over which to supply the cleaning gas inside the first film deposition gas nozzle 270b where an amount of sediments accumulated therein is the second largest is set to be the second longest. A time over which to supply the cleaning gas inside the first film deposition gas nozzle 270c where an amount of sediments accumulated therein is the smallest is set to be the shortest. It is thus possible to make it difficult for deterioration caused by over-etching to occur in the first film deposition gas nozzles 270a, 270b, and 270c while removing the sediments adhering to the inner walls of the respective first film deposition gas nozzles 270a, 270b, and 270c in a satisfactory manner.

As has been described, in this embodiment, the gas supply means 225 adjusts the times over which to supply the cleaning gas to the first film deposition gas nozzles 270a, 270b, and 270c by varying the timing at which a supply of the cleaning gas is started while making the timing at which the supply of the cleaning gas ends coincide in the first film deposition gas nozzles 270a, 270b, and 270c. It should be noted that the end points of the cleaning in the respective first film deposition gas nozzles 270a, 270b, and 270c are made to coincide with one another, whereas the end points of the cleaning in the first film deposition gas nozzles 270a, 270b, and 270c are not made to coincide with the end point of the cleaning inside the process chamber 201.

Alternatively, it may be configured in such a manner that $F_2$, $ClF_3$, a mixed gas of $F_2$ and HF ($F_2$+HF), and a mixed gas of these gases and $N_2$ are supplied to the first film deposition gas nozzles 270a through 270d according to the types, amounts of accumulation, and so forth of the sediments accumulated on the inner walls of the film deposition gas nozzles 270 and the sediments accumulated inside the process chamber 201 while $N_2$ is supplied to the gas nozzle 272. Also, it may be configured in such a manner that the same cleaning gas seed is supplied to the first film deposition gas nozzles 270a through 270d and the gas nozzle 272 and a dilution ratio of the cleaning gas (mixing ratios of $N_2$) to be supplied to the respective nozzles is adjusted independently nozzle by nozzle. As has been described, it is possible to supply different cleaning gases independently under the optimal conditions according to the types and amounts of accumulation of the respective sediments.

As has been described, according to the substrate processing apparatus 100 of this embodiment, it is possible to supply different cleaning gases inside the film deposition gas nozzles 270 and inside the process chamber 201 independently. Accordingly, even in a case where the types of sediments on the inner walls of the film deposition gas nozzles 270 and inside the process chamber 201 are different, it is possible to supply the cleaning gases under the conditions that suit the types of the respective sediments. Accordingly, the sediments can be removed in a satisfactory manner while preventing over-etching, and a time needed for the cleaning step can be shortened because the removal of the sediments is accelerated.

Also, in a case where amounts of accumulation of the sediments on the inner walls of the respective film deposition gas nozzles 270 differ among the plural film deposition gas nozzles 270, cleaning gases can be supplied independently under the conditions suitable to the respective amounts of accumulation of the sediments. It is thus possible to perform the cleaning that best suits the interiors of the film deposition gas nozzles 270. To be more concrete, by setting gas seeds ($NF_3$, $F_2$, $ClF_3$, a mixed gas of $F_2$ and HF ($F_2$+HF), and a mixed gas of these gases of four types and $N_2$) of the cleaning gases to be supplied to the respective film deposition gas nozzles 270 and the supply times of the cleaning gases (for example, the gas supply start times t0, t1, t2, and t3 of FIG. 3) for the film deposition gas nozzles 270 nozzle by nozzle, removal of the respective sediments is accelerated, which can in turn shorten the time needed for the cleaning step.

Also, according to the substrate processing apparatus 100 of this embodiment, cleaning can be performed automatically without having to remove or replace the film deposition gas nozzles 270. It is thus possible to enhance the operation rate of the apparatus.

Figure 4:
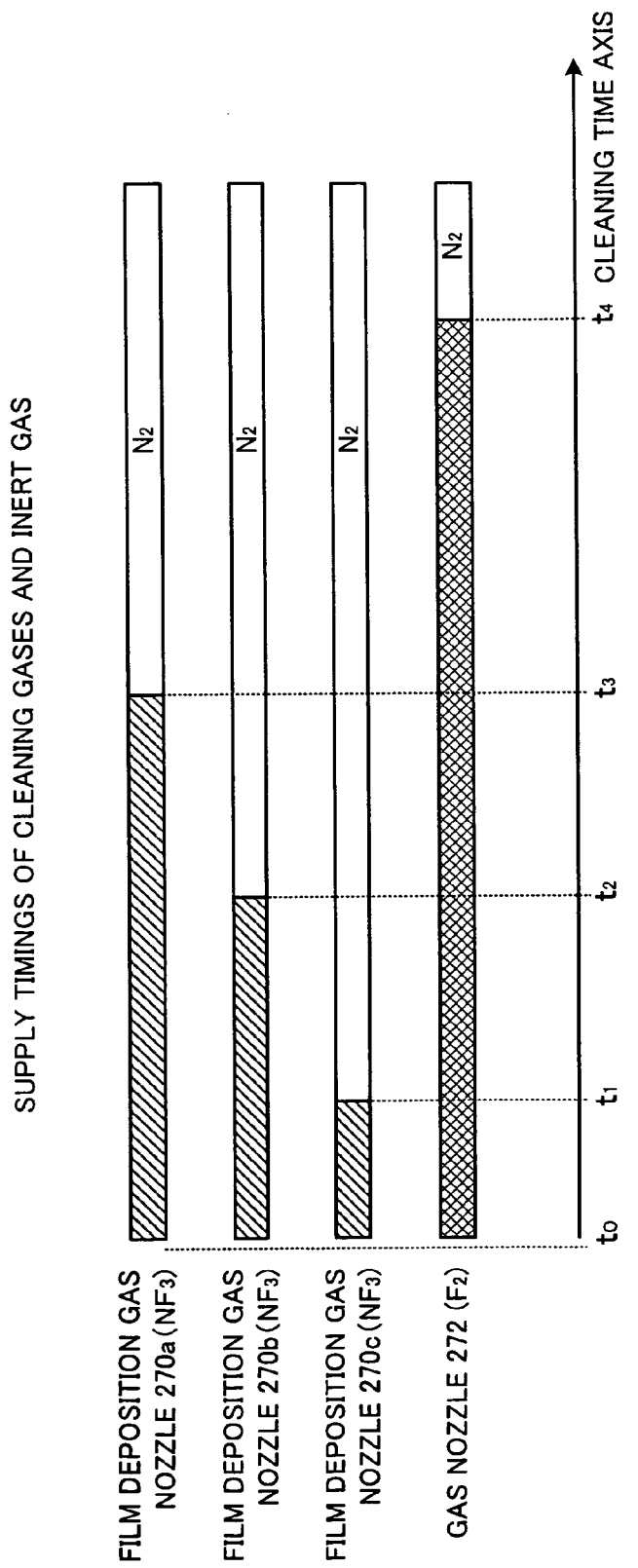
FIG. 4 is a timing chart showing supply timings of cleaning gases and an inert gas by gas supply means in a substrate processing apparatus according to a modification of the first embodiment of the invention.

FIG. 4 shows a method of supplying the cleaning gas according to a modification of the first embodiment of the invention. In the embodiment described above, $F_2$ is supplied to the first film deposition gas nozzle 270a, $NF_3$ is supplied to the first film deposition gas nozzles 270b and 270c, and a mixed gas of $F_2$ and $N_2$ ($F_2$+$N_2$) is supplied to the gas nozzle 272. In contrast to this configuration, in this modification, $NF_3$ is supplied to the first film deposition gas nozzles 270a, 270b, and 270c, and $F_2$ is supplied to the gas nozzle 272.

Also, in the first embodiment described above, the times over which to supply the cleaning gas to the first film deposition gas nozzles 270a, 270b, and 270c are adjusted by varying the timing at which a supply of the cleaning gas is started while making the timing at which the supply of the cleaning gas ends coincide in the first film deposition gas nozzles 270a, 270b, and 270c. In contrast to this configuration, in this modification, times over which to supply the cleaning gas to the first film deposition gas nozzles 270a, 270b, and 270c are adjusted by varying the timing at which a supply of the cleaning gas ends while making the timing at which a supply of the cleaning gas is started coincide. It should be noted that, in this modification, the end points of the cleaning in the respective first film deposition gas nozzles 270a, 270b, and 270c are not made to coincide with one another, and the end points of the cleaning in the first film deposition gas nozzles 270a, 270b, and 270c are not made to coincide with the end point of the cleaning inside the process chamber 201, either.

As has been described, the method of supplying the cleaning gas can be determined without being limited to the supply method described in the embodiment above by way of example. Instead of the cleaning gas supply method of the first embodiment or the method of supplying the cleaning gas of the modification shown in FIG. 4, for example, it may be configured in such a manner that $F_2$ diluted with an inert gas, that is, a mixed gas of $F_2$ and $N_2$ (for example, 10% of $F_2$+90% of $N_2$), is supplied to the first film deposition gas nozzles 270a, 270b, and 270c and $NF_3$ (for example, 100% of $NF_3$) is supplied to the gas nozzle 272.

Second Embodiment

Hereinafter, a second embodiment of the invention will be described on the basis of the drawings.

Figure 5:
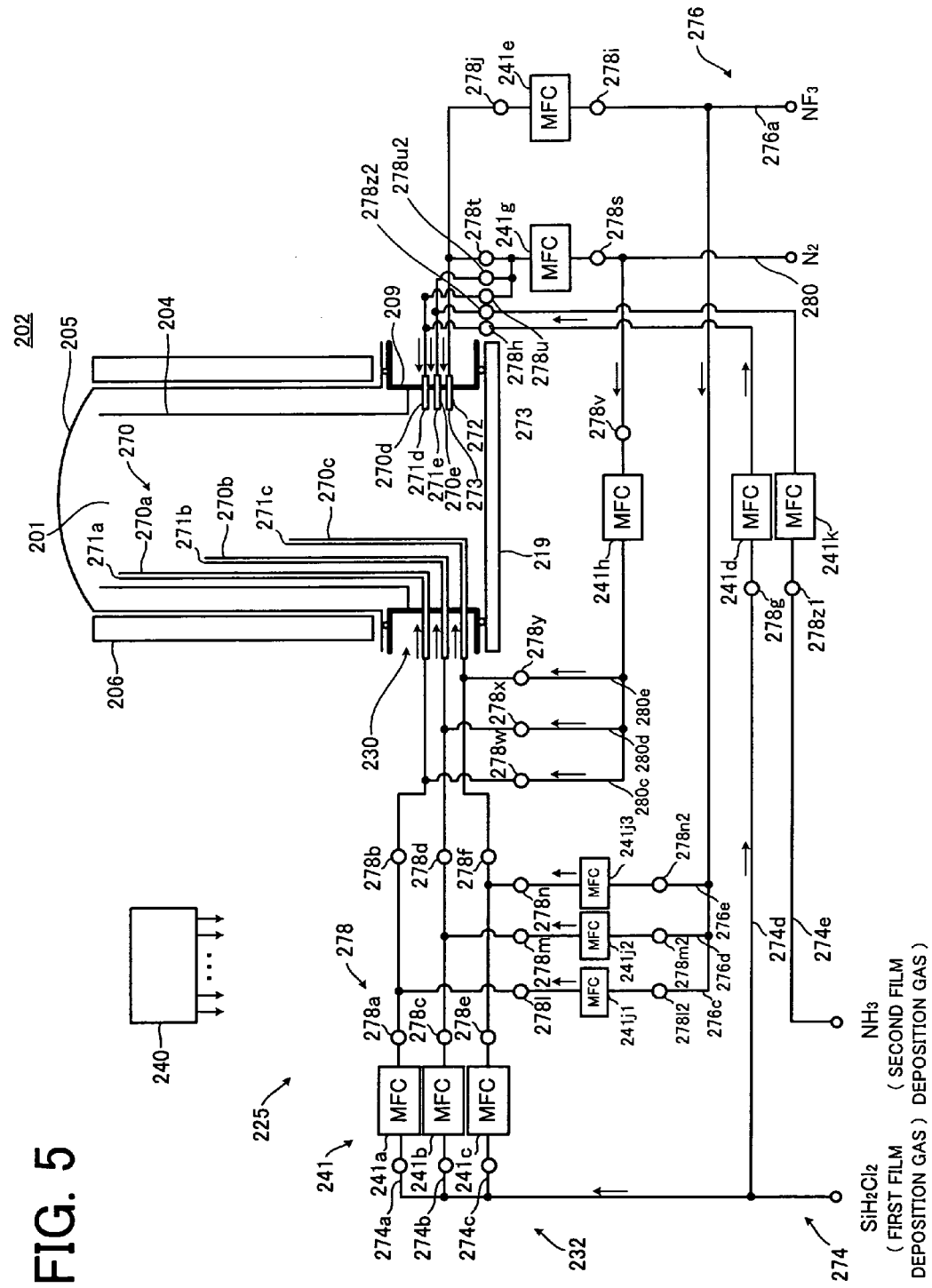
FIG. 5 is a schematic view schematically showing the configuration of gas supply means in a substrate processing apparatus according to a second embodiment of the invention.

FIG. 5 is a schematic view of gas supply means 225 in a substrate processing apparatus 100 suitably used in the second embodiment of the invention. Because the configuration of the process furnace 202 suitably used in the second embodiment is the same as the configuration of the process furnace 202 suitably used in the first embodiment described above, the illustration and the description thereof are omitted herein.

The gas supply means 225 used in the first embodiment described above is capable of adjusting the flow rate and the concentration of the cleaning gas separately for the first film deposition gas nozzles 270a, 270b, and 270c and for the gas supply nozzle 272. However, it is incapable of adjusting the flow rate and the concentration of the cleaning gas for the first film deposition gas nozzles 270a, 270b, and 270c nozzle by nozzle. In contrast to this incapability, the gas supply means 225 used in the second embodiment is configured so as to be capable of adjusting the flow rate and the concentration of the cleaning gas for the first film deposition gas nozzles 270a, 270b, and 270c nozzle by nozzle.

Also, in contrast to the gas supply means 225 used in the first embodiment described above that uses the plural types of cleaning gases including $NF_3$ and $F_2$, the gas supply means 225 used in the second embodiment uses one type of cleaning gas, $NF_3$, alone.

In the first embodiment described above, the cleaning gas supply line 276 has the first cleaning gas supply line 276a used to supply $NF_3$, which is the first cleaning gas, and the second cleaning gas supply line 276b used to supply $F_2$, which is the second cleaning gas. In contrast to this configuration, as is shown in FIG. 5, the cleaning gas supply line 276 of the second embodiment does not have the second cleaning gas supply line 276b and has the first cleaning gas supply line 276a alone, and $NF_3$, which is the first cleaning gas, is supplied using the first cleaning gas supply line 276a.

In addition, in the first embodiment described above, the first cleaning gas supply line 276a is connected to the supply source of, for example, $NF_3$ as the first cleaning gas, on the upper stream side, and is connected to the first film deposition gas nozzle 270d via the air valves 278i and 278j and the MFC 241e at one end on the lower stream side. Also, the first cleaning gas supply line 276a is connected to the MFC 241j via the air valve 278k at the other end on the lower stream side. It branches to three lines 276c, 276d, and 276e on the lower stream side of the MFC 241j, and the branched three lines 276c, 276d, and 276e are connected to the first film deposition gas supply lines 274a, 274b, and 274c via the air valves 278l, 278m, and 278n, respectively. In short, in the first embodiment described above, the other end on the lower stream side of the first cleaning gas supply line 276a branches to three lines on the lower stream side of the MFC 241j, which is one mass flow controller.

In contrast to this configuration, the other end on the lower stream side of the first cleaning gas supply line 276a used in the second embodiment branches to three lines on the upper stream side of the mass flow controller, and one mass flow controller is provided to each branched line.

To be more concrete, an air valve 278l2 is connected to the line 276c, which is one of three lines branched from the first cleaning gas supply line 276a at the other end on the lower stream side and an MFC 241j1 is connected thereto on the lower stream side of the air valve 278l2 whereas the line 276c is connected to the first film deposition gas supply line 274a via the air valve 278l on the lower stream side of the MFC 241j1.

Also, an air valve 278m2 is connected to the line 276d, which is another one of three lines branched from the first cleaning gas supply line 276a at the other end on the lower stream side and an MFC 241j2 is connected thereto on the lower stream side of the air valve 278m2 whereas the line 276d is connected to the first film deposition gas supply line 274b via the air valve 278m on the lower stream side of the MFC 241j2.

Further, an air valve 278n2 is connected to a line 276e, which is still another one of three lines branched from the first cleaning gas supply line 276a at the other end on the lower stream side and an MFC 241j3 is connected thereto on the lower stream side of the air valve 278n2 whereas the line 276e is connected to the first film deposition gas supply line 274c via the air valve 278n on the lower stream side of the MFC 241j3.

As has been described, the second embodiment is provided with the MFC 241j1, the MFC 241j2, and the MFC 241j3 that adjust the flow rate of the cleaning gas to be supplied from the three lines 276c, 276d, and 276e branched from the first cleaning gas supply line 276a to the first film deposition gas nozzles 270a, 270b, and 270c via the first film deposition gas supply lines 274a, 274b, and 274c, respectively. Hence, by controlling the MFC 241j1, the MFC 241j2, and the MFC 241j3 independently by means of the controller 240, it is possible to adjust the flow rate of the cleaning gas to be supplied to the first film deposition gas nozzles 270a, 270b, and 270c independently, or to adjust the concentration of the cleaning gas to be supplied to the first film deposition gas nozzles 270a, 270b, and 270c independently. Portions same as those of the first embodiment are labeled with the same reference numerals in FIG. 5 and the description thereof is omitted herein.

Figure 6:
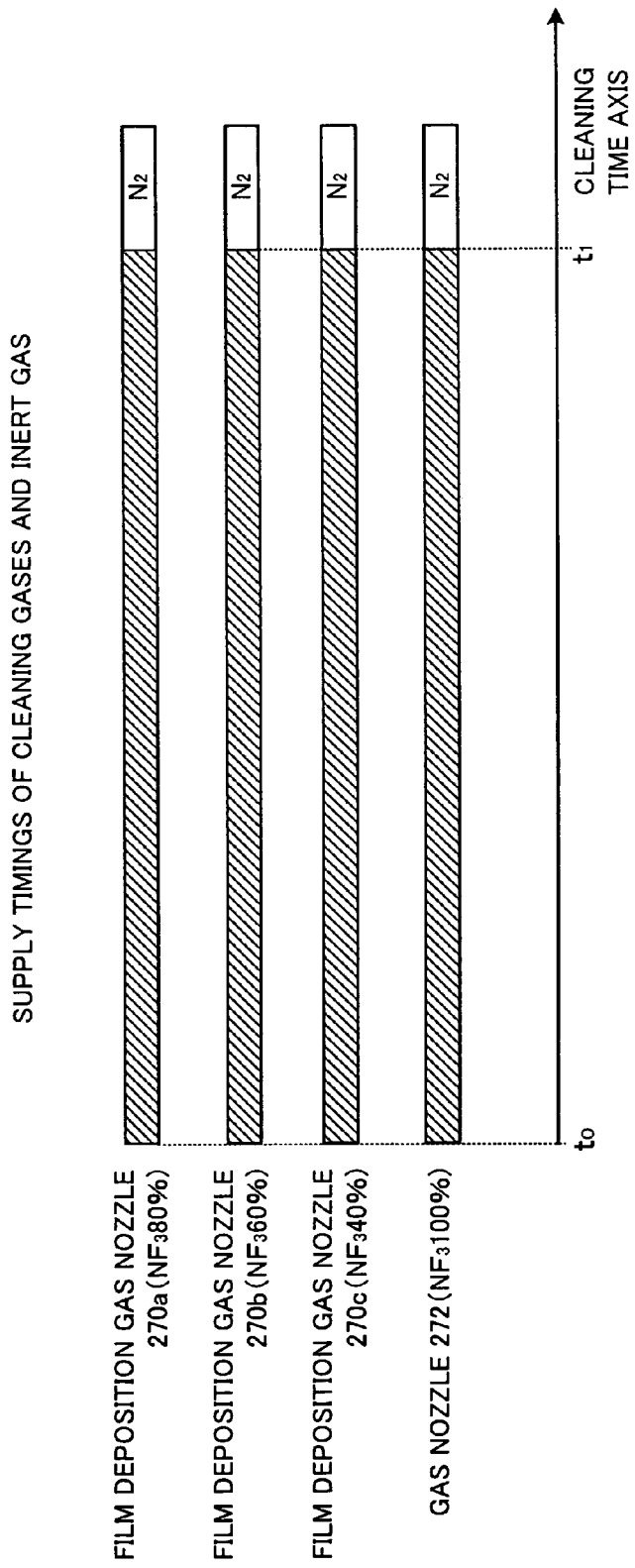
FIG. 6 is a timing chart showing supply timings of cleaning gases and an inert gas by the gas supply means in the substrate processing apparatus according to the second embodiment of the invention.

FIG. 6 shows a method of supplying the cleaning gas of the second embodiment.

Initially (at the time axis to of FIG. 6), the controller 240 starts to supply the cleaning gas inside the process chamber 201 from the first film deposition gas nozzles 270a, 270b, and 270c and the gas nozzle 272.

To be more concrete, at the time axis to, the controller 240 opens the air valves 278i and 278j provided to the first cleaning gas supply line 276a and supplies $NF_3$ at a concentration of 100% inside the process chamber 201 via the gas nozzle 272 as the cleaning gas while adjusting a flow rate thereof by means of the MFC 241e.

Also, at the time axis t0, the controller 240 opens the air valves 278v, 278w, 278x, and 278y provided to the inert gas supply line 280, and supplies the gas $N_2$ inside the first film deposition gas nozzles 270a, 270b, and 270c via the first film deposition gas supply lines 274a, 274b, and 274c, respectively. At the same time, it opens the air valves 278l, 278l2, 278m, 278m2, 278ln, and 278n2 provided to the lines 276c, 276d, and 276e branched from the first cleaning gas supply line 276a and supplies $NF_3$ inside the first film deposition gas nozzles 270a, 270b, and 270c via the first film deposition gas supply lines 274a, 274b, and 274c, respectively. In short, the controller 240 supplies $NF_3$ diluted with the gas $N_2$ as the cleaning gas inside the first film deposition gas nozzles 270a, 270b, and 270c.

When supplying $NF_3$ diluted with $N_2$ inside the first film deposition gas nozzles 270a, 270b, and 270c, the controller 240 adjusts the flow rate of $NF_3$ to be supplied inside the first film deposition gas nozzles 270a, 270b, and 270c and controls the concentration of the $NF_3$ gas to be supplied inside the first film deposition gas nozzles 270a, 270b, and 270c to be at 80%, 60%, and 40%, respectively, by controlling the MFC 241j1, the MFC 241j2, and the MFC 241j3.

After a predetermined time has elapsed (at the time axis t1 of FIG. 6), the controller 240 controls the gas supply means 225 so that $N_2$ alone is supplied to the first film deposition gas nozzles 270a, 270b, and 270c by stopping a supply of $NF_3$ inside the first film deposition gas nozzles 270a, 270b, and 270c from the first cleaning gas supply line 276a. To be more concrete, the controller 240 closes the air valves 278l, 278l2, 278m, 278m2, 278ln, and 278n2 provided to the lines 276c, 276d, and 276e branched from the first cleaning gas supply line 276a.

Also, at the time axis t1 of FIG. 6, the controller 240 stops supplying $NF_3$ to the gas nozzle 272 and starts to supply $N_2$ to the gas nozzle 272. To be more concrete, the controller 240 closes the air valves 278i and 278j provided to the first cleaning gas supply line 276a and opens the air valves 278s and 278t provided to the inert gas supply line 280.

As has been described, it is possible to remove the sediments inside the first film deposition gas nozzles 270a, 270b, and 270c and inside the process chamber 201 in a satisfactory manner while preventing over-etching of the first film deposition gas nozzles 270a, 270b, and 270c by configuring the gas supply means 225 used in the second embodiment in such a manner so as to adjust the concentration of the cleaning gas to be supplied inside the process chamber 201 via the gas nozzle 272 where an amount of adhering sediments is larger than that inside the first film deposition gas nozzles 270a, 270b, and 270c to be higher than the concentration of the cleaning gas to be supplied inside the first film deposition gas nozzle 270a, 270b, and 270c.

Also, the gas supply means 225 used in the second embodiment determines the concentration of the cleaning gas to be supplied inside the plural film deposition gas nozzles 270 according to amounts of sediments accumulated inside the respective film deposition gas nozzles 270. More specifically, of the film deposition gas nozzles 270a, 270b, and 270c, the concentration of the cleaning gas to be supplied inside the film deposition gas nozzle 270a where an amount of sediments accumulated therein is the largest is set to be the highest, and the concentration of the cleaning gas to be supplied inside the film deposition gas nozzle 270b where an amount of sediments accumulated therein is the second largest is set to be the second highest. The concentration of the cleaning gas to be supplied inside the film deposition gas nozzle 270c where an amount of sediments accumulated therein is the smallest is set to be the lowest. This configuration makes it possible to remove the sediments inside the first film deposition gas nozzles 270a, 270b, and 270c in a satisfactory manner while preventing over-etching of the first film deposition gas nozzles 270a, 270b, and 270c. It should be noted that in the second embodiment, the cleaning end points inside the respective first film deposition gas nozzles 270a, 270b, and 270c are made to coincide with one another and also the cleaning end points inside the first film deposition gas nozzles 270a, 270b, and 270c are made to coincide with the cleaning end point inside the process chamber 201.

Figure 7:
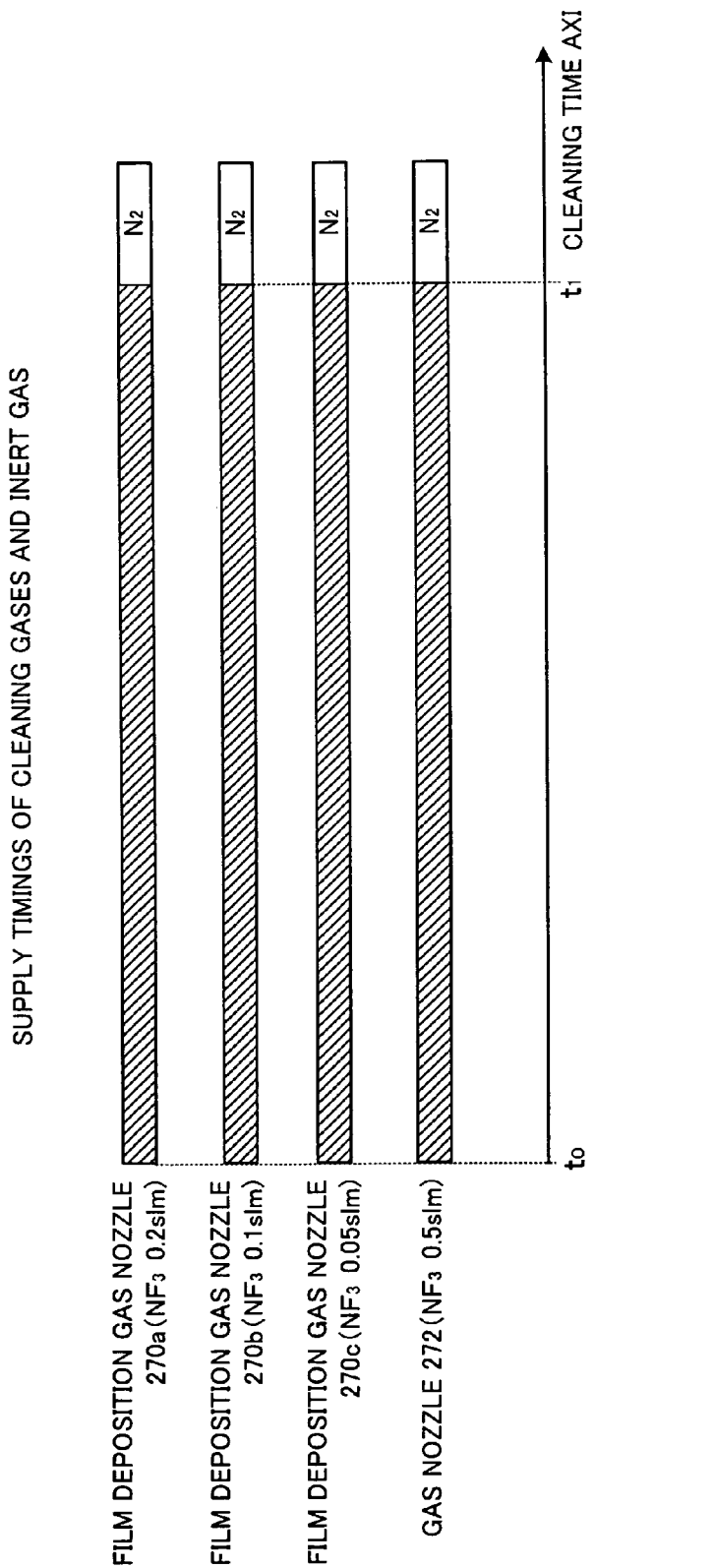
FIG. 7 is a timing chart showing supply timings of cleaning gases and an inert gas by gas supply means in a substrate processing apparatus according to a modification of the second embodiment of the invention.

FIG. 7 shows a method of supplying the cleaning gas according to a first modification of the second embodiment of the invention. In the second embodiment described above, $NF_3$ is supplied in such a manner that the concentration of $NF_3$ as the cleaning gas to be supplied to the first film deposition gas nozzles 270a 270b and 270c and the gas nozzle 272 varies from nozzle to nozzle. In contrast to this configuration, in the first modification, the flow rate of $NF_3$ to be supplied to the first film deposition gas nozzles 270a, 270b, and 270c and the gas nozzle 272 varies from nozzle to nozzle. Herein, $NF_3$ of 0.2 slm is supplied to the first film deposition gas nozzle 270a, $NF_3$ of 0.1 slm is supplied to the first film deposition gas nozzle 270b, $NF_3$ of 0.05 slm is supplied to the first film deposition gas nozzle 270c, and the cleaning gas $NF_3$ of 0.5 slm is supplied to the gas nozzle 272.

A flow rate of $NF_3$ to be supplied to the first film deposition gas nozzles 270a, 270b, and 270c and the gas nozzle 272 is adjusted by the MFC 241j1, the MFC 241j2, the MFC 241j3, and the MFC 241e under the control of the controller 240. According to the first modification, the same advantages as those of the second embodiment can be achieved.

Figure 8:
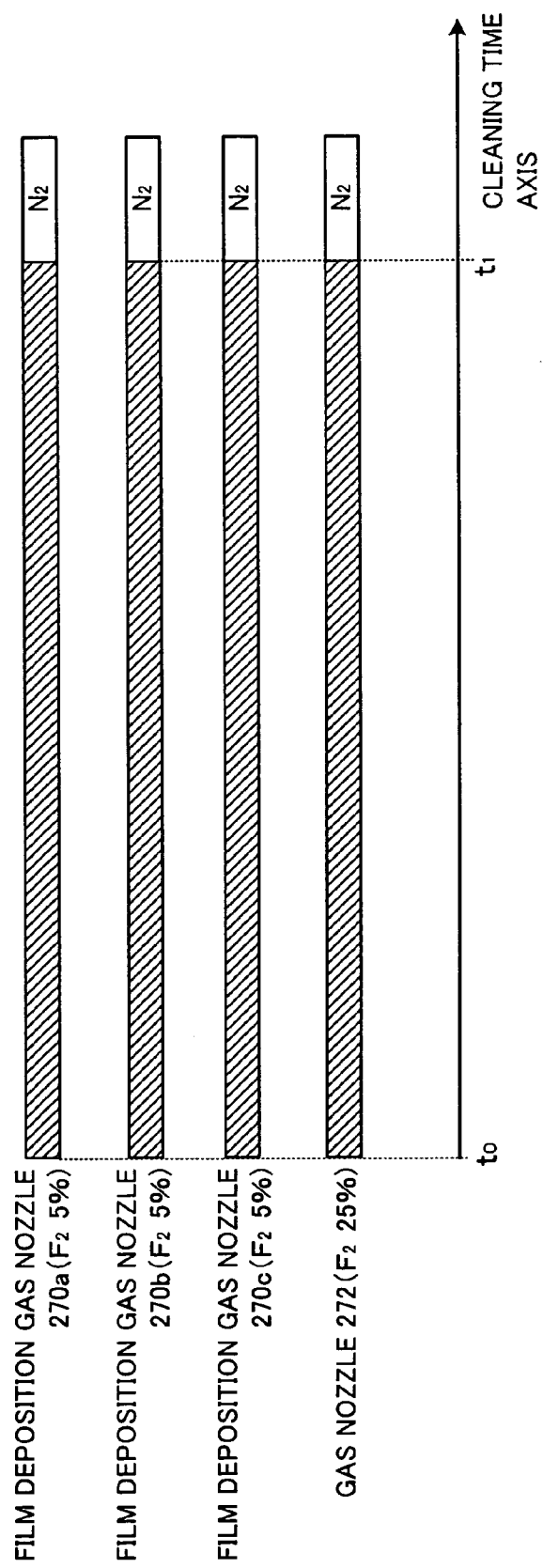
FIG. 8 is a timing chart showing supply timings of cleaning gases and an inert gas by gas supply means in a substrate processing apparatus according to a second modification of the second embodiment of the invention.

FIG. 8 shows a method of supplying the cleaning gas according to a second modification of the second embodiment of the invention. In the second embodiment described above, $NF_3$ is supplied to the first film deposition gas nozzles 270a, 270b, and 270c and the gas nozzle 272 as the cleaning gas. In contrast to this configuration, in the second modification, $F_2$ is supplied to the first film deposition gas nozzles 270a, 270b, and 270c and the gas nozzles 272 as the cleaning gas. That is to say, in contrast to the second embodiment described above in which the first cleaning gas supply line 276a is connected to the supply source of $NF_3$ on the upper stream side, the first cleaning gas supply line 276a is connected to the supply source of $F_2$ on the upper stream side in the second modification.

Also, in the second embodiment above, $NF_3$ is supplied in such a manner that the concentration of $NF_3$ to be supplied to the first film deposition gas nozzles 270a, 270b, and 270c and the gas nozzle 272 varies from nozzle to nozzle. In contrast to this configuration, in the second modification, $F_2$ is supplied in such a manner that the concentration of $F_2$ to be supplied to the first film deposition gas nozzles 270a, 270b, and 270c is equally 5% and the concentration of $F_2$ to be supplied to the process chamber 201 via the gas nozzle 272 is 25%.

The concentration of $F_2$ to be supplied to the first film deposition gas nozzles 270a, 270b, and 270c and the gas nozzle 272 is adjusted in the same manner as in the second embodiment above by the MFC 241j1, the MFC 241j2, the MFC 241j3, and the MFC 241e under the control of the controller 240.

The second modification is configured in such a manner that the sediments inside the first film deposition gas nozzles 270a, 270b, and 270c and inside the process chamber 201 can be removed in a satisfactory manner while preventing over-etching of the first film deposition gas nozzles 270a, 270b, and 270c by lowering the concentration of $F_2$ to be flown inside the first film deposition gas nozzles 270a, 270b, and 270c as a whole.

Figure 9:
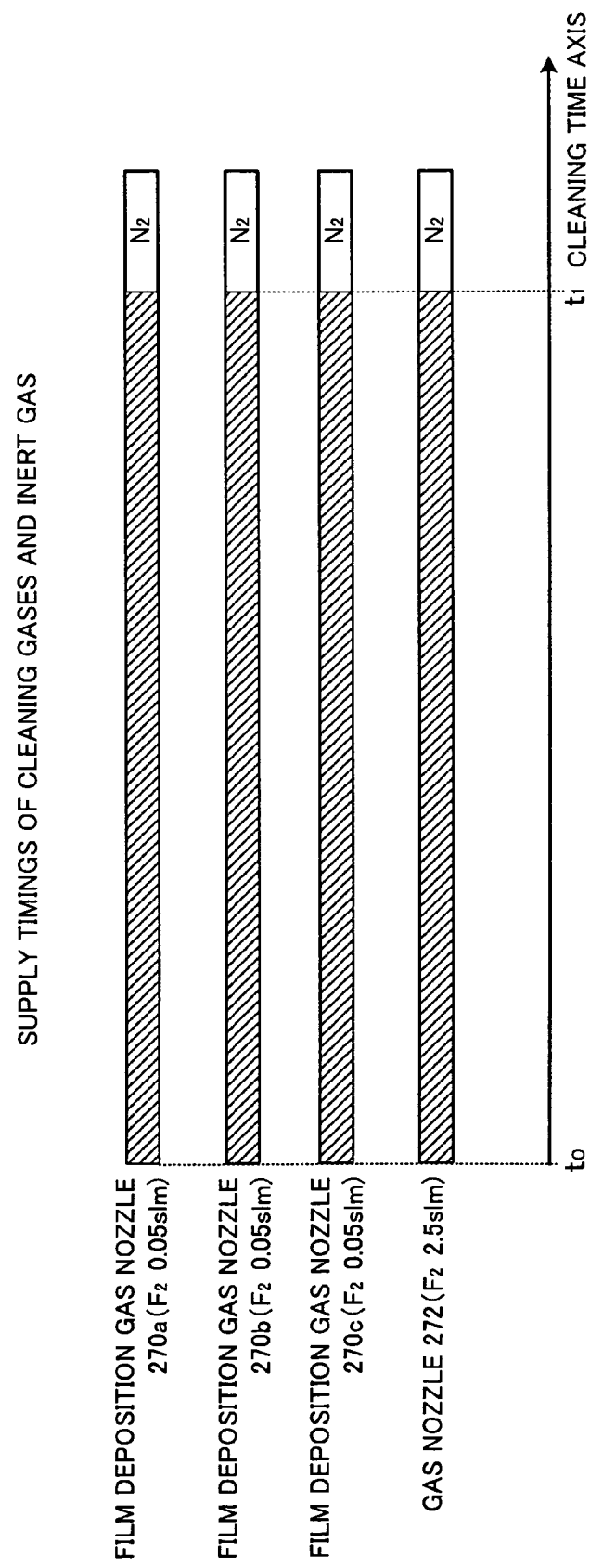
FIG. 9 is a timing chart showing supply timings of cleaning gases and an inert gas by gas supply means in a substrate processing apparatus according to a third modification of the second embodiment of the invention.

FIG. 9 is a method of supplying the cleaning gas according to a third modification of the second embodiment of the invention. In the second embodiment described above, $NF_3$ as the cleaning gas is supplied to the first film deposition gas nozzles 270a, 270b, and 270c and the gas nozzle 272. In contrast to this configuration, in the third modification, $F_2$ is supplied to the first film deposition gas nozzles 270a, 270b, and 270c and the gas nozzle 272 as the cleaning gas in the same manner as in the second modification. That is to say, in contrast to the second embodiment described above in which the first cleaning gas supply line 276a is connected to the supply source of $NF_3$ on the upper stream side, the first cleaning gas supply line 276a is connected to the supply source of $F_2$ on the upper stream side in the third modification.

Also, in the second embodiment described above, $NF_3$ is supplied in such a manner that the concentration of $NF_3$ to be supplied to the first film deposition gas nozzles 270a, 270b, and 270c and the gas nozzle 272 varies from nozzle to nozzle. In contrast to this configuration, in the third modification, $F_2$ is supplied in such a manner that the flow rate of $F_2$ to be supplied to the first film deposition gas nozzles 270a, 270b, and 270c is equally 0.05 slm and a flow rate of $F_2$ to be supplied to the process chamber 201 via the gas nozzle 272 is 2.5 slm.

The flow rate of $F_2$ to be supplied to the first film deposition gas nozzles 270a, 270b, and 270c and the gas nozzle 272 is adjusted by the MFC 241j1, the MFC 241j2, the MFC 241j3, and the MFC 241e, respectively, under the control of the controller 240.

The third modification is configured in such a manner that the sediments inside the first film deposition gas nozzles 270a, 270b, and 270c and inside the process chamber 201 can be removed in a satisfactory manner while preventing over-etching of the first film deposition gas nozzles 270a, 270b, and 270c by lowering the flow rate of $F_2$ to be flown inside the first film deposition gas nozzles 270a, 270b, and 270c as a whole.

Third Embodiment

Hereinafter, a third embodiment of the invention will be described on the basis of the drawings.

Figure 10:
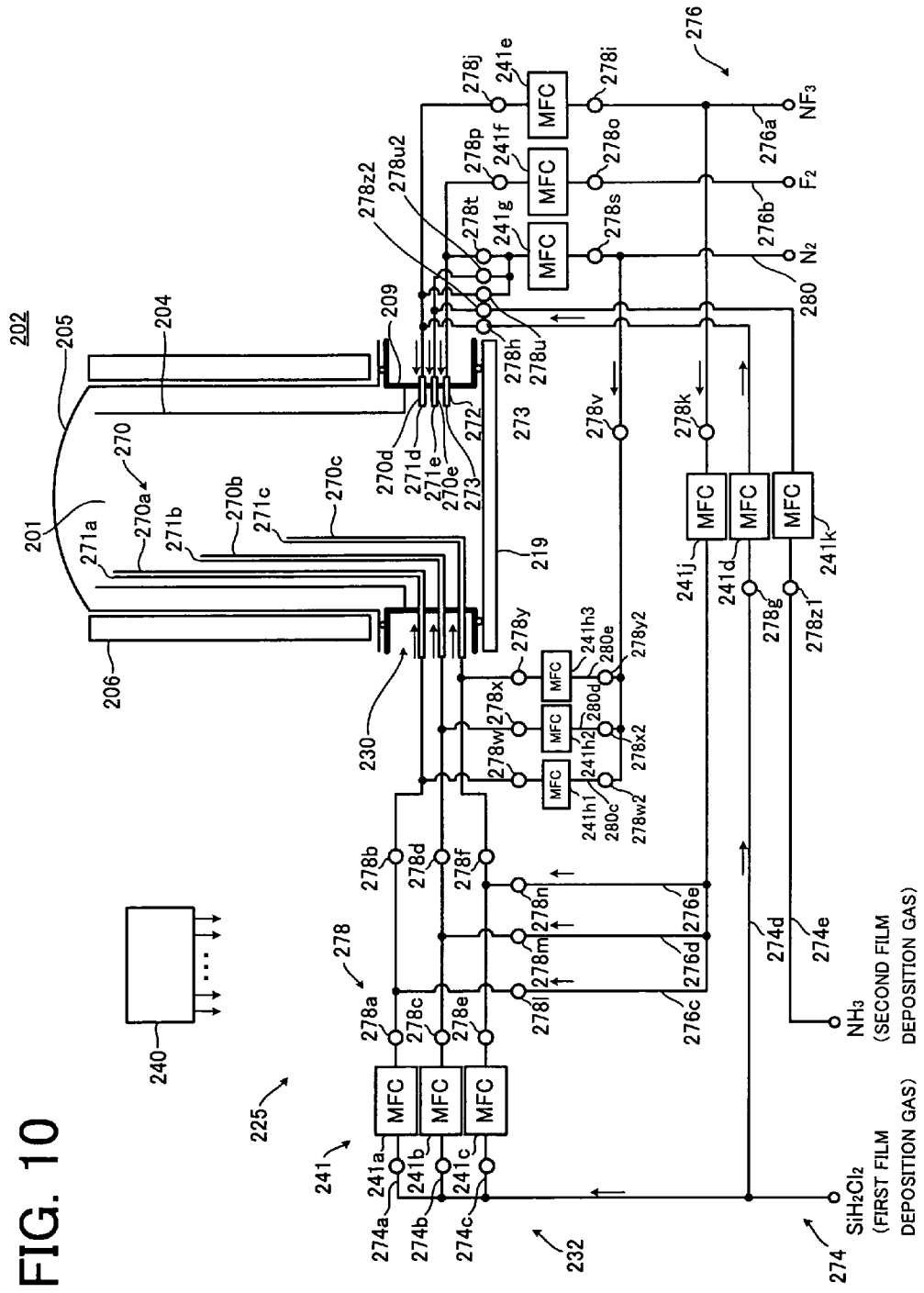
FIG. 10 is a schematic view schematically showing the configuration of gas supply means in a substrate processing apparatus according to a third embodiment of the invention.

FIG. 10 is a schematic view showing gas supply means 225 in a substrate processing apparatus 100 suitably used in the third embodiment of the invention. Because the process furnace 202 suitably used in the third embodiment is of the same configuration as the process furnace 202 used in the first and second embodiments described above, the illustration and the description thereof are omitted herein.

The gas supply means 225 used in the first embodiment described above is incapable of adjusting the flow rate and the dilution ratio of a dilution gas that dilutes the cleaning gas for the film deposition gas nozzles 270a, 270b, and 270c nozzle by nozzle. In contrast to this incapability, the gas supply means 225 used in the third embodiment is configured so as to be capable of adjusting the flow rate and the dilution ratio of the dilution gas to be supplied to the film deposition gas nozzles 270a, 270b, and 270c nozzle by nozzle.

Also, in contrast to the gas supply means 225 that is used in the first embodiment described above and configured to be capable of supplying $F_2$ used as the second cleaning gas inside the process chamber 201 via the first film deposition gas supply line 274a and the gas nozzle 272, the gas supply means 225 of the third embodiment is configured in such a manner that $F_2$ used as the second cleaning gas is supplied inside the process chamber 201 via the gas nozzle 272 alone.

To be more concrete, in contrast to the first embodiment described above in which the second cleaning gas supply line 276b used to supply $F_2$ as the second cleaning gas is connected to the gas nozzle 272 via the air valves 278o and 278p and the MFC 241f and is also connected to the first film deposition gas supply line 274a via the air valves 278q and 278r and the MFC 241i, as is shown in FIG. 10, the second cleaning gas supply line 276b is not connected to the first film deposition gas supply line 274a but connected to the gas nozzle 272 alone in the third embodiment.

Also, in the first embodiment described above, the inert gas supply line 280 is connected to the supply source of $N_2$ on the upper stream side, and one branched line on the lower stream side is connected to the MFC 241h via the air valve 278v and branches to three lines 280c, 280d, and 280e on the lower stream side of the MFC 241h in such a manner that the branched three lines 280c, 280d, and 280e are connected to the first film deposition gas supply lines 274a, 274b, and 274c via the air valves 278w, 278x, and 278y, respectively. In short, in the first embodiment above, one line of the inert gas supply line 280 on the lower stream side branches to three lines on the lower stream side of the MFC 241h as one mass flow controller.

In contrast to this configuration, one line of the inert gas supply line 280 on the lower stream side used in the third embodiment branches to three lines, to each of which one mass flow controller is provided. To be more concrete, as is shown in FIG. 10, the MFC 241h1 is connected to the line 280c, which is one of three lines branched from the inert gas supply line 280 on the lower stream side, via the air valve 278w2 and the line 280c is connected to the first film deposition gas supply line 274a via the air valve 278w on the lower stream side of the MFC 241h1.

The MFC 241h2 is connected to the line 280d, which is another one of three lines branched from the inert gas supply line 280 on the lower stream side via the air valve 278x2 and the line 280d is connected to the first film deposition gas supply line 274b via the air valve 278x on the lower stream side of the MFC 241h2.

Also, the MFC 241h3 is connected to the line 280e, which is still another one of the three lines branched from the inert gas supply line 280 on the lower stream side via the air valve 278y2, and the line 280e is connected to the first film deposition gas supply line 274c via the air valve 278y on the lower stream side of the MFC 241h3.

As has been described, in the third embodiment, the MFC 241h1, the MFC 241h2, and the MFC 241h3 that adjust the flow rate of $N_2$ to be supplied to the respective first deposition gas nozzles 270a, 270b, and 270c, respectively, via the first film deposition gas supply lines 274a, 274b, and 274 from the three lines 280c, 280d, and 280e branched from the inert gas supply line 280 are provided. Hence, by controlling the MFC 241h1, the MFC 241h2, and the MFC 241h3 independently by means of the controller 240, it is possible to independently adjust the flow rate of the dilute gas, such as the inert gas, and the dilution ratio of the cleaning gas to be supplied to the first film deposition gas supply nozzles 270a, 270b, and 270c, that is, the concentration of the cleaning gas. Portions same as those in the first embodiment are labeled with the same reference numerals in FIG. 10 and the description thereof is omitted herein.

Figure 11:
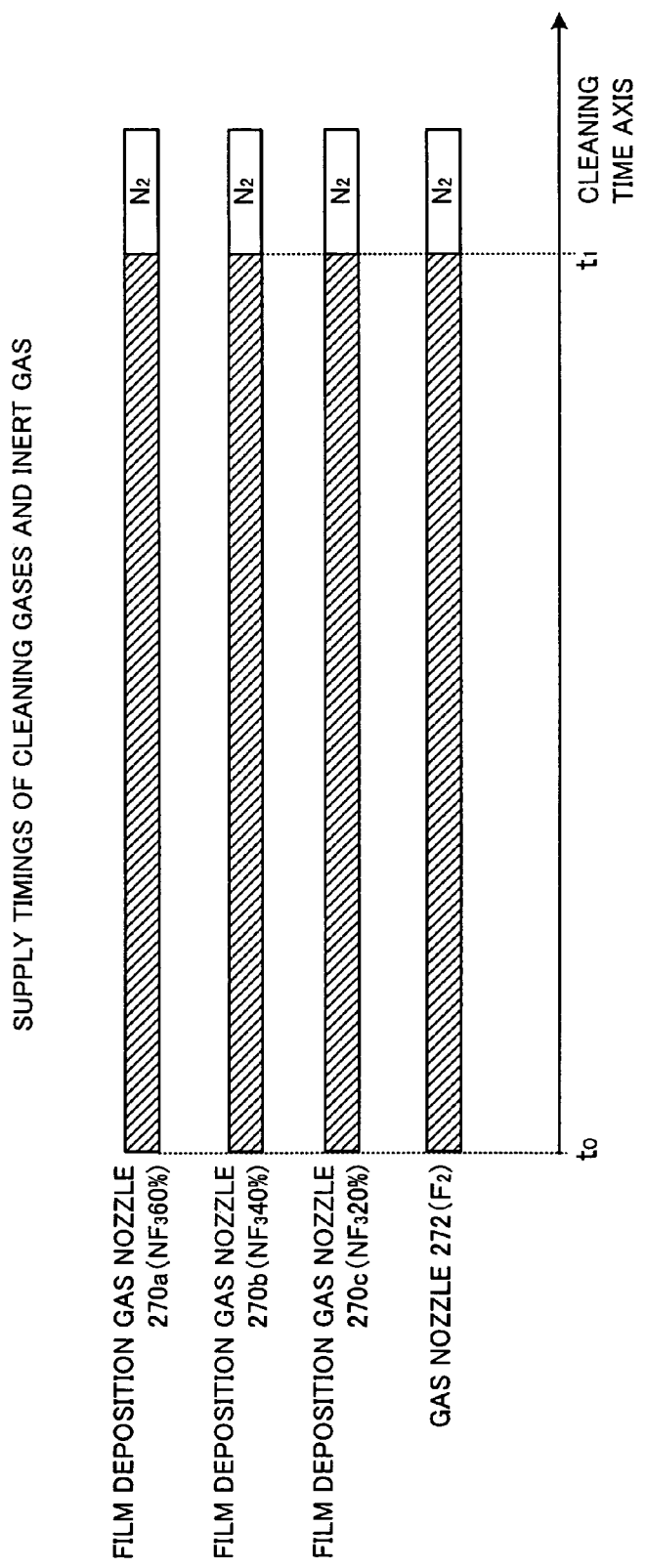
FIG. 11 is a timing chart showing supply timings of cleaning gases and an inert gas by the gas supply means in the substrate processing apparatus according to the third embodiment of the invention.

FIG. 11 shows a method of supplying the cleaning gas in the third embodiment.

Initially (at the time axis t0 of FIG. 11), the controller 240 starts to supply $NF_3$ as the first cleaning gas inside the first film deposition gas nozzles 270a, 270b, and 270c, and starts to supply $F_2$ as the second cleaning gas inside the process chamber 201 via the gas nozzle 272.

To be more concrete, at the time axis t0, the controller 240 opens the air valves 278o and 278p provided to the second cleaning gas supply line 276b and supplies $F_2$ inside the process chamber 201 via the gas nozzle 272 while adjusting the flow rate thereof by means of the MFC 241f.

Also, at the time axis to, the controller 240 opens the air valves 278v, 278w2, 278w, 278x2, 278x, 278y2, and 278y provided to the inert gas supply line 280 and the three lines 280c, 280d, and 280e branched therefrom on the lower stream side, and supplies $N_2$ inside the first film deposition gas nozzles 270a, 270b, and 270c while adjusting the flow rate thereof by means of the MFC 241h1, the MFC 241h2, and the MFC 241h3, respectively. Also, at the time axis t0, the controller 240 opens the air valves 278k, 278l, 278m, and 278n provided to the first cleaning gas supply lien 276a, and supplies $NF_3$ inside the first film deposition gas nozzles 270a, 270b, and 270c via the first film deposition gas supply lines 274a, 274b, and 274c, respectively. In short, the controller 240 supplies $NF_3$ diluted with $N_2$ to the first film deposition gas nozzles 270a, 270b, and 270c.

When supplying $NF_3$ diluted with $N_2$ inside the first film deposition gas nozzles 270a, 270b, and 270c, the controller 240 controls the concentration of $NF_3$ to be supplied inside the first film deposition gas nozzles 270a, 270b, and 270c to be at 60%, 40%, and 20%, respectively, by adjusting the flow rate of $N_2$ to be supplied inside the first film deposition gas nozzles 270a, 270b, and 270c by means of the MFC 241h1, the MFC 241h2, and the MFC 241h3, respectively, under the control of the controller 240.

After a predetermined time has elapsed (at the time axis t1 of FIG. 11), the controller 240 controls the gas supply means 225 so that $N_2$ alone is supplied inside the first film deposition gas nozzles 270a, 270b, and 270c by stopping a supply of $NF_3$ inside the first film deposition gas nozzles 270a, 270b, and 270c from the first cleaning gas supply line 276a. To be more concrete, the controller 240 closes the air valves 278l, 278m, 278n, and 278k provided to the first cleaning gas supply line 276a.

Also, after a predetermined time has elapsed (at the time t1 of FIG. 11), the controller 240 stops a supply of $F_2$ to the gas nozzle 272 from the second cleaning gas supply line 276b and starts a supply of $N_2$ to the gas nozzle 272 from the inert gas supply line 280. To be more concrete, it closes the air valves 278o and 278p provided to the second cleaning gas supply line 276b and opens 278s and 278t provided to the inert gas supply line 280.

As has been described, in this embodiment, by changing the types of gas between the cleaning gas to be supplied via the gas nozzle 272 inside the process chamber 201 where an amount of adhering sediments is large and the cleaning gas to be supplied inside the first film deposition gas nozzles 270a, 270b, and 270c where an amount of adhering sediments is small by means of the gas supply means 225, it is possible to make it difficult for deterioration caused by over-etching to occur in the film deposition gas nozzles 270a, 270b, and 270c while removing the sediments inside the process chamber

201 and inside the first film deposition gas supply nozzle 270a, 270b, and 270c in a satisfactory manner. Besides $N_2$, an inert gas, such as Ar and He, and $O_2$ may be used as the dilution gas.

Also, the gas supply means 225 used in the third embodiment determines the concentration of the cleaning gas to be supplied inside the plural film deposition gas nozzles 270 according to amounts of sediments accumulated inside the respective film deposition gas nozzles 270. More specifically, of the first film deposition gas nozzles 270a, 270b, and 270c, the concentration of the cleaning gas to be supplied inside the first film deposition gas nozzle 270a where an amount of sediments accumulated therein is the largest is set to be the highest, and the concentration of the cleaning gas to be supplied inside the first film deposition gas nozzle 270b where an amount of sediments accumulated therein is the second largest is set to be the second highest. Also, the concentration of the cleaning gas to be supplied inside the first film deposition gas nozzle 270c where an amount of sediments accumulated therein is the smallest is set to be the lowest. In addition, the concentration of the cleaning gas to be supplied inside the first film deposition gas nozzles 270a, 270b, and 270c is adjusted by adjusting flow rate of an inert gas to be supplied to the first film deposition gas nozzles 270a, 270b, and 270c.

Fourth Embodiment

Hereinafter, a fourth embodiment of the invention will be described on the basis of the drawings.

Figure 12:
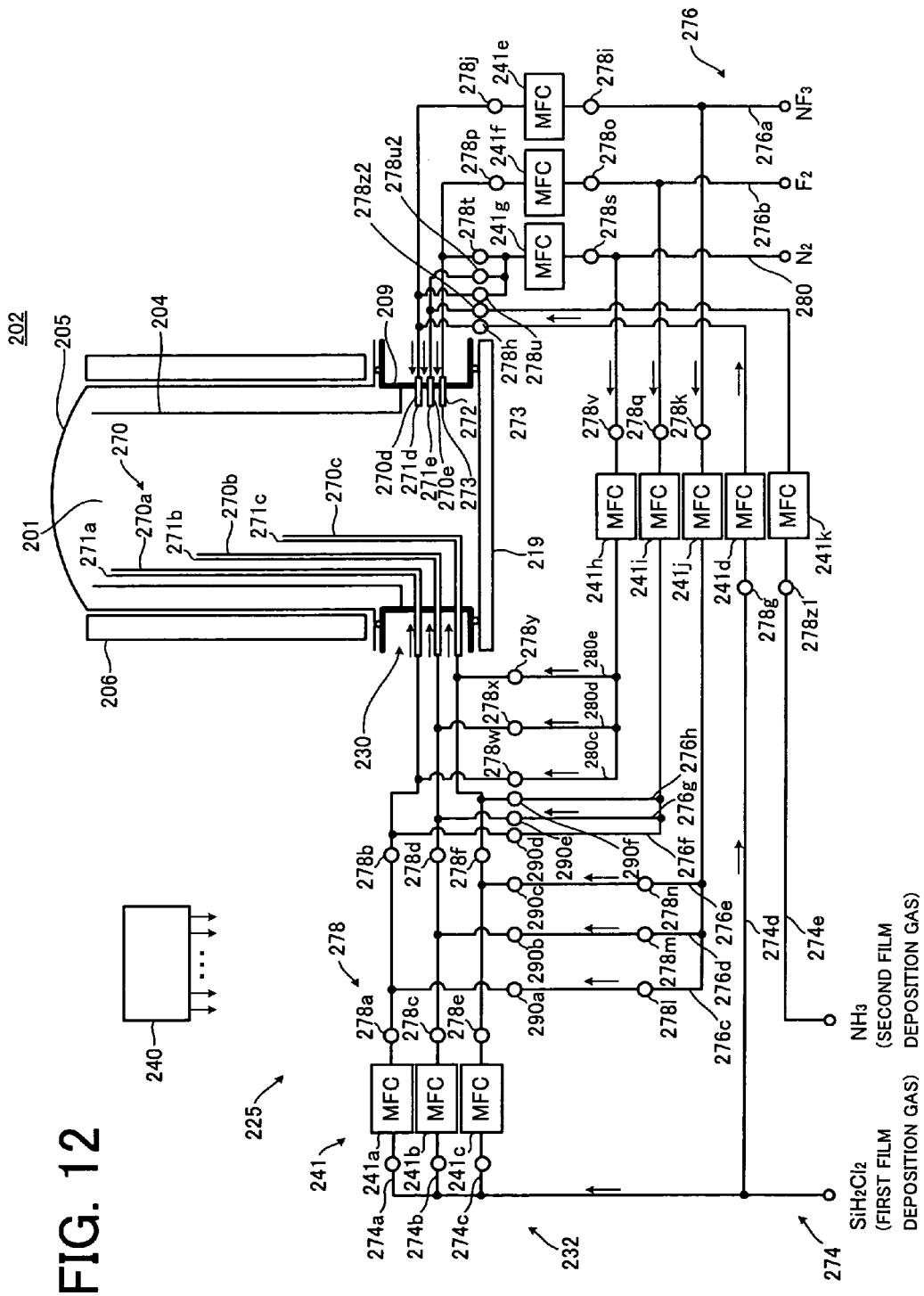
FIG. 12 is a schematic view schematically showing the configuration of gas supply means in a substrate processing apparatus according to a fourth embodiment of the invention.

FIG. 12 is a schematic view showing gas supply means 225 in a substrate processing apparatus 100 suitably used in the fourth embodiment of the invention. Because the process furnace 202 suitably used in the fourth embodiment is of the same configuration as the process furnace 202 used in the first through third embodiments described above, the illustration and the description thereof are omitted.

The gas supply means 225 used in the first embodiment described above is incapable of adjusting the flow rate and the concentration of $NF_3$ as the first cleaning gas to be supplied to the first film deposition gas nozzles 270a, 270b, and 270c nozzle by nozzle. In contrast to this incapability, the gas supply means 225 used in the fourth embodiment is configured so as to be capable of adjusting the flow rate and the concentration of $NF_3$ as the first cleaning gas to be supplied to the first film deposition gas nozzles 270a, 270b, and 270c nozzle by nozzle independently. To be more concrete, needle valves 290a, 290b, and 290c are provided upstream of positions, respectively, at which the first cleaning gas supply line 276a is connected to the first film deposition gas supply lines 274a, 274b, and 274c. By operating the needle valve 290a, it is possible to adjust the flow rate and the concentration of $NF_3$ to be supplied inside the first film deposition gas supply line 274a. By operating the needle valve 290b, it is possible to adjust the flow rate and the concentration of $NF_3$ to be supplied inside the first film deposition gas supply line 274b. By operating the needle valve 290c, it is possible to adjust the flow rate and the concentration of $NF_3$ to be supplied to the first film deposition gas supply line 274c.

Also, the gas supply means 225 used in the first embodiment described above is configured in such a manner that not only is it capable of supplying $F_2$ as the second cleaning gas inside the process chamber 201 from the gas nozzle 272, but it is also capable of supplying $F_2$ inside the first film deposition gas nozzle 270a among the first film deposition gas nozzles 270a, 270b, and 270c. In contrast to this configuration, in the fourth embodiment, it is configured in such a manner that $F_2$ as the second cleaning gas can be supplied inside the first film deposition gas nozzles 270a, 270b, and 270c while adjusting the flow rate and the concentration independently from nozzle to nozzle. To be more concrete, the second cleaning gas supply line 276b branches to three lines 276f, 276g, and 276h on the lower stream side of the MFC 241i, and the three branched lines 276f, 276g, and 276h are connected to the first film deposition gas supply lines 274a, 274b, and 274c via the needle valves 290d, 290e, and 290f, respectively. Accordingly, by operating the needle valve 290d, it is possible to adjust the flow rate and the concentration of $F_2$ to be supplied inside the first film deposition gas supply line 274a. By operating the needle valve 290e, it is possible to adjust the flow rate and the concentration of $F_2$ to be supplied inside the first film deposition gas supply line 274b. By operating the needle valve 290f, it is possible to adjust the flow rate and the concentration of $F_2$ to be supplied inside the first film deposition gas supply line 274c.

In order to adjust the flow rate and the concentration, it may be configured in such a manner that MFCs (Mass Flow Controllers) are provided to positions where the needle valves 290a, 290b, 290c, 290d, 290e, and 290f are supposed to be provided instead of providing these needle valves and these MFCs are controlled by the controller 240.

As has been described using the first through fourth embodiments, in the invention, in a case where sediments of plural types having different chemical compositions adhere to the interiors of the apparatus, the conditions (cleaning conditions) to remove the sediments are set according to the types of sediments. When the conditions are set, the etching reactivity between the sediments and the cleaning gas is taken into account, and conditions such that decrease the etching rate are set for the sediments having high reactivity with the cleaning gas, so that the cleaning gas is maintained at a low concentration under a low pressure or at a low flow rate. Also, for the sediments having small reactivity with the cleaning gas, conditions such that increase the etching rate are set, so that the cleaning gas is maintained at a high concentration under a high pressure at a high flow rate.

Also, in the invention, the cleaning conditions are determined by taking the etching reactivity of the sediments into account, so that deterioration caused by over-etching hardly occurs in the apparatus forming members by configuring in such a manner that cleaning processing ends at the same timing to the extent possible in different places within the apparatus.

Also, as has been descried using the first through fourth embodiments above, in a case where an amount of accumulated sediments (thickness of sediments) of the same type (the same chemical composition) varies, the invention is configured in such a manner that conditions such that increase the etching rate are set for a portion where an amount of sediments is large for the cleaning gas to be maintained at a high concentration under a high pressure or at a high flow rate. Also, conditions such that decrease the etching rate are set for a portion where an amount of sediments is small for the cleaning gas to be maintained at a low concentration under a low pressure or at a low flow rate.

Also, in the invention, the cleaning conditions are determined by taking an amount of sediments (thickness of sediments) into account, so that deterioration caused by over-etching hardly occurs in the apparatus forming members by configuring in such a manner that cleaning processing ends at the same timing in portions where the film thickness of sediments varies.

The respective embodiments above have described the method of supplying the cleaning gas by varying the type, the flow rate, the concentration, and so forth of the cleaning gas inside the first film deposition gas nozzles 270a, 270b, and 270c and inside the process chamber 201. However, it is possible to perform cleaning using the cleaning gas by making the type, the flow rate, and the concentration of the cleaning gas all the same inside the first film deposition gas nozzles 270a, 270b, and 270c and inside the process chamber 201 using the substrate processing apparatus 100 according to the respective embodiments. In this case, however, in order to suppress damage inside the first film deposition gas nozzles 270a, 270b, and 270c, it is necessary to lower the concentration and the flow rate of the cleaning gas used in common. When the concentration and the flow rate of the cleaning gas are lowered, so is the etching rate. Hence, a time needed for the cleaning inside the process chamber 201, and hence a time needed for the cleaning in total may possible be extended.

It should be noted, however, that even when the etching rate is lowered, the cleaning may possibly be performed efficiently depending on the conditions that have been set. In this case, it is sufficient to use the cleaning gas of one type, and there is an advantage that the need to change the cleaning conditions between inside the first film deposition gas nozzles 270a, 270b, and 270c and inside the process chamber 201 can be eliminated.

Figure 13:
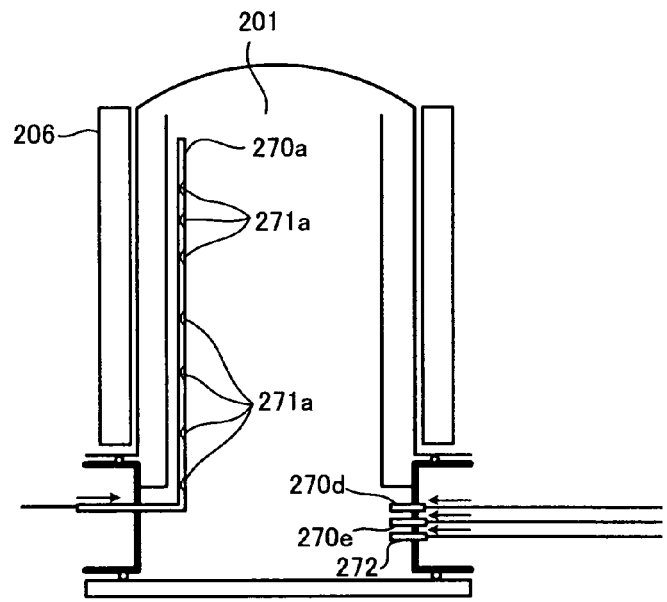
FIG. 13 is a cross section showing a first modification of a nozzle used in the substrate processing apparatus according to the first through fourth embodiments of the invention.

FIG. 13 shows a first modification of the nozzle used in the substrate processing apparatus according to the first through fourth embodiments described above. In the first through fourth embodiments described above, the first film deposition gas nozzles 270a, 270b, and 270c (so-called multi-nozzle) formed of plural long nozzles are used in part of the supply portion to supply the first film deposition gas inside the process chamber 201. In contrast to this configuration, as is shown in FIG. 13, used in the first modification is a so-called porous nozzle, which is a film deposition gas nozzle 270a formed of single long nozzle provided with plural film deposition gas ports 271a.

As in the first embodiment described above, the first modification has the first film deposition gas nozzle 270d, the second film deposition gas nozzle 270e, and the gas nozzle 272. As in the first embodiment described above, for example, $SiH_2Cl_2$ as the first film deposition gas is supplied to the first film deposition gas nozzles 270a and 270d, $NH_3$ as the second film deposition gas is supplied to the second film deposition gas nozzle 270e, and $N_2$ is supplied from the gas nozzle 272 during the film deposition. During the cleaning, $NF_3$ as the first cleaning gas is supplied to the first film deposition gas nozzle 270a, $F_2$ as the second cleaning gas is supplied to the gas nozzle 272, and $N_2$ is supplied to the first film deposition gas nozzle 270d and the second film deposition gas nozzle 270e.

Figure 14:
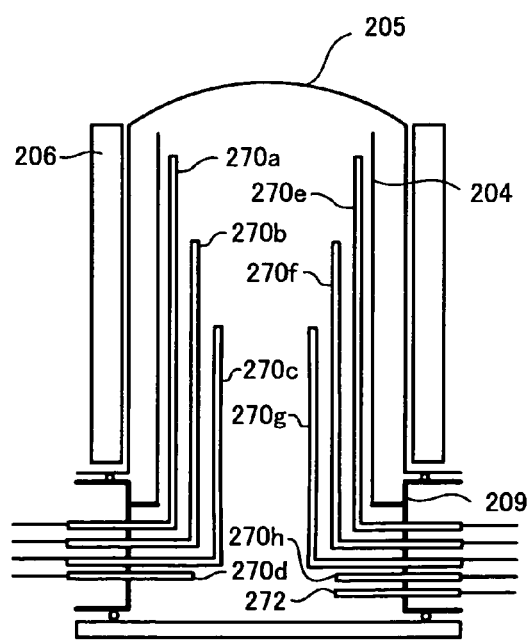
FIG. 14 is a cross section showing a second modification of a nozzle used in the substrate processing apparatus according to the first through fourth embodiments of the invention.

FIG. 14 shows a second modification of the nozzle used in the substrate processing apparatus according to the first through fourth embodiments described above. In the first through fourth embodiments described above, $NH_3$ as the second film deposition gas is supplied inside the process chamber 201 from the single second film deposition gas nozzle 270e. In contrast to this configuration, in the second modification, $NH_3$ as the second film deposition gas is supplied inside the process chamber from four second film deposition gas nozzles 270e, 270f, 270g, and 270h.

As in the first embodiment, the second modification has the first film deposition gas nozzles 270a, 270b, 270c, and 270d and the gas nozzle 272. For example, $SiH_2Cl_2$ as the first film deposition gas is supplied to the first film deposition gas nozzles 270a, 270b, 270c, and 270d, $NH_3$ as the second film deposition gas is supplied to the second film deposition gas nozzles 270e, 270f, 270g, and 270h, and $N_2$ is supplied from the nozzle 272 during film deposition. During the cleaning, $NF_3$ as the first cleaning gas is supplied to the first film deposition gas nozzles 270a, 270b, and 270c, $F_2$ as the second cleaning gas is supplied to the gas nozzle 272, and $N_2$ is supplied to the first film deposition gas nozzle 270d and the second film deposition gas nozzles 270e, 270f, 270g, and 270h.

The respective embodiments and modifications above have chiefly described an example where the invention is applied to a case where $SiH_2Cl_2$ (dicyclosilane, hereinafter, abbreviated as DCS) as the first film deposition gas and $NH_3$ is used as the second film deposition gas. The first and second film deposition gases, however, are not limited to those specified above. For example, in order to deposit an $Si_3N_4$ film, the invention is also applicable to a case where another gas including Si atoms (silane-based gas) is used as the first film deposition gas instead of $SiH_2Cl_2$ and $NH_3$, which is a gas including N atoms as in the first through fourth embodiments, is used as the second film deposition gas. As the silane-based gas, for example, $SiH_2(NH(C_4H_9))_2$ (bis(tertiary-butylamino) silane, hereinafter, abbreviated as BTBAS), $Si_2Cl_6$ (hexachlorodisilane, hereinafter, abbreviated as HDC), $SiCl_4$ (tetrachlorosilane, hereinafter, abbreviated as TCS), and $SiH_4$ can be used.

In these cases, $Si_3N_4$ adheres to the interior of the process chamber 201 as first sediments and Si adheres to the interiors of the first film deposition gas nozzles 270a, 270b, and 270c as second sediments.

Also, for example, in order to deposit an $SiO_2$ film, the invention is also applicable to a case where a gas including an Si element (silane-based gas) is used as the first film deposition gas and a gas including O atoms is used as the second film deposition gas. To be more concrete, for example, the invention can be applied to a case where $SiH_4$ is used as the first film deposition gas and $N_2O$ is used as the second film deposition gas.

Also, the invention is applicable, for example, to a case where $SiH_4$ is used as the first film deposition gas and $O_2$ is used as the second film deposition gas.

Also, the invention is applicable, for example, to a case where $Si(OC_2H_5)_4$ (tetraethoxy silane, hereinafter, abbreviated as TEOS) is used as the first film deposition gas and $O_2$ is used as the second film deposition gas. In this case, $O_2$, which is the second film deposition gas, is not necessarily used.

Also, the invention is applicable to a case where BTBAS is used as the first film deposition gas and $O_2$ is used as the second film deposition gas.

Also, the invention is applicable to a case where DCS is used as the first film deposition gas and $N_2O$ is used as the second film deposition gas.

In these cases, $SiO_2$ adheres to the interior of the process chamber 201 as first sediments and Si adheres to the interiors of the first film deposition gas nozzles 270a, 270b, and 270c as second sediments.

Also, for example, in order to deposit an SiON film, the invention is applicable to a case where DCS, which is a gas including Si atoms (silane-based gas), is used as the first film deposition gas and $N_2O$ and $NH_3$, which are gases including atoms and N atoms, respectively, are used as the second film deposition gas. In this case, SiON adheres to the interior of the process chamber 201 as first sediments and Si adheres to the interiors of the first film deposition gas nozzles 270a, 270b, and 270c as second sediments.

Also, for example, in order to deposit an SiC film, the invention is applicable to a case where DCS, which is a gas including Si atoms (silane-based gas), is used as the first film deposition gas and $C_3H_6$, which is a gas including C atoms, is used as the second film deposition gas. In this case, SiC adheres to the interior of the process chamber 201 as first sediments and Si adheres to the interiors of the first film deposition gas nozzles 270a, 270b, and 270c as second sediments.

Also, for example, in order to deposit an SiCN film, the invention is applicable to a case where DCS, which is a gas including Si atoms (silane-based gas), is used as the first film deposition gas and $C_3H_6$ and $NH_3$, which are gases including C atoms and N atoms, respectively, are used as the second film deposition gas. In this case, SiCN adheres to the interior of the process chamber 201 as first sediments and Si adheres to the interiors of the first film deposition gas nozzles 270a, 270b, and 270c as second sediments.

In other words, the invention is generally applicable to a case where a gas that includes at least one element among plural elements forming a thin film to be deposited and is capable of accumulating a film solely is used as the first film deposition gas and a gas that includes at least another element among the plural elements and is incapable of accumulating a film solely is used as the second film deposition gas.

The respective embodiments and modifications above have chiefly described a case where Si is the second sediments adhering to the interiors of the first film deposition gas nozzles 270a, 270b, and 270c and $Si_3N_4$ is the first sediments adhering to the interior of the process chamber 201 and these sediments are removed using $NF_3$ as the first cleaning gas and $F_2$ as the second cleaning gas, respectively. However, the combination of the cleaning gases used to remove Si as the second sediments and $Si_3N_4$ as the first sediments is not limited to the one specified above. The invention is also applicable, for example, to a case where a high concentration of $NF_3$ is used as the first cleaning gas to remove Si as the second sediments and a low concentration of $NF_3$ is used as the second cleaning gas to remove $Si_3N_4$ as the first sediments.

Also, the invention is applicable, for example, to a case where a high concentration of $F_2$ is used as the first cleaning gas and a low concentration of $F_2$ is used as the second cleaning gas.

Also, the invention is applicable, for example, to a case where a high concentration of $ClF_3$ is used as the first cleaning gas and a low concentration of $ClF_3$ is used as the second cleaning gas.

Also, the invention is applicable, for example, to a case where $F_2$ is used as the first cleaning gas and a mixed gas of $F_2$ and HF is used as the second cleaning gas.

Also, the invention is applicable, for example, to a case where $Cl_2$ is used as the first cleaning gas and $F_2$ is used as the second cleaning gas.

The respective embodiments and modifications above have chiefly described a case where Si is the second sediments adhering to the interiors of the first film deposition gas nozzles 270a, 270b, and 270c, and $Si_3N_4$ is the first sediments adhering to the interior of the process chamber 201. However, the second and first sediments to which the invention is applicable are not limited to those specified above. The invention is also applicable, for example, to a case where Si is the second sediments and any one of $SiO_2$, SiON, SiC, and SiCN is the first sediments.

Also, as the cleaning gases for the combination of these second and first sediments, that is, in a case where Si is the second sediments and any one of $SiO_2$, SiON, SiC, and SiCN is the first sediments, for example, a high concentration of $NF_3$ can be used as the first cleaning gas to remove Si as the second sediments and a low concentration of $NF_3$ can be used as the second cleaning gas to remove $SiO_2$, SiON, SiC, and SiCN as the first sediments. Hence, the invention is also applicable to this case.

Also, for example, a high concentration of $F_2$ can be used as the first cleaning gas and a low concentration of $F_2$ can be used as the second cleaning gas, and the invention is also applicable to this case.

Also, for example, a high concentration of $ClF_3$ can be used as the first cleaning gas and a low concentration of $ClF_3$ can be used as the second cleaning gas, and the invention is also applicable to this case.

In particular, in a case where Si is the second sediments and $SiO_2$ is the first sediments, $F_2$ can be used as the first cleaning gas to remove Si as the second sediments and HF can be used as the second cleaning gas to remove $SiO_2$ as the first sediments. The invention is also applicable to this case.

It should be noted that an HF gas readily reacts with $SiO_2$ and does not react with Si and $Si_3N_4$. Also, a $Cl_2$ gas readily reacts with Si and hardly reacts with $SiO_2$. When the cleaning gases are selected, it is necessary to take into account the reactivity of the clean gases with the sediments as described above.

In the respective embodiments above, the substrate processing apparatus of a batch type that applies heat treatment to plural substrates at a time was used. The invention, however, is not limited to this configuration, and a sheet-feed type may be used as well.

Additional Feature 1

A method of manufacturing a semiconductor device, comprising the steps of:

carrying a substrate into a process chamber;

depositing a thin film on the substrate by supplying inside the process chamber a first film deposition gas including at least one element among plural elements forming a thin film to be deposited and capable of accumulating a film solely and a second film deposition gas including at least another element among the plural elements and incapable of accumulating a film solely;

carrying the substrate on which is deposited the thin film out from inside the process chamber; and removing a first sediment adhering to an interior of the process chamber and a second sediment adhering to an interior of the supply portion and having a chemical composition different from a chemical composition of the first sediment by supplying cleaning gases inside the process chamber and inside a supply portion that supplies the first film deposition gas while changing at least one of a supply flow rate, a concentration, and a type between a cleaning gas to be supplied inside the process chamber and a cleaning gas to be supplied inside the supply portion.

Additional Feature 2

The method of manufacturing a semiconductor device set forth in the additional feature 1 is configured in such a manner that, in the thin film depositing step, the interior of the process chamber and the interior of the supply portion are heated to a temperature high enough to let at least the first film deposition gas undergo heat decomposition.

Additional Feature 3

The method of manufacturing a semiconductor device set forth in the additional feature 1 is configured in such a manner that the first sediment is chiefly made of the plural elements and the second sediment is chiefly made of the at least one element.

Additional Feature 4

The method of manufacturing a semiconductor device set forth in the additional feature 1 is configured in such a manner that:

the first film deposition gas is a silicon-containing gas;

the second film deposition gas is at least one of a nitrogen-containing gas, an oxygen-containing gas, and a carbon-containing gas, and the thin film is a thin film including at least one element among silicon, nitrogen, oxygen, and carbon; and in the thin film depositing step, a sediment chiefly made of silicon adheres to the interior of the supply portion and a sediment chiefly made of silicon and at least one element among nitrogen, oxygen, and carbon adheres to the interior of the process chamber.

Additional Feature 5

The method of manufacturing a semiconductor device set forth in the additional feature 1 is configured in such a manner that:

the first film deposition gas is a silane-based gas;
the second film deposition gas is an ammonia gas;
the thin film is a silicon nitride film; and
in the thin film depositing step, a sediment chiefly made of silicon adheres to the interior of the supply portion and a sediment chiefly made of silicon and nitrogen adheres to the interior of the process chamber.

Additional Feature 6

The method of manufacturing a semiconductor device set forth in the additional feature 1 is configured in such a manner that:

the first film deposition gas is a silane-based gas;
the second film deposition gas is a nitrous oxide ($N_2O$) gas or an oxygen ($O_2$) gas;
the thin film is a silicon oxide film; and
in the thin film depositing step, a sediment chiefly made of silicon adheres to the interior of the supply portion, and a sediment chiefly made of silicon and oxygen adheres to the interior of the process chamber.

Additional Feature 7

The method of manufacturing a semiconductor device set forth in the additional feature 1 is configured in such a manner that:

the first film deposition gas is a silane-based gas;
the second film deposition gas is a nitrous oxide ($N_2O$) gas and an ammonia ($NH_3$) gas;
the thin film is a silicon oxynitride film; and
in the thin film depositing step, a sediment chiefly made of silicon adheres to the interior of the supply portion, and a sediment chiefly made of silicon, oxygen, and nitrogen adheres to the interior of the process chamber.

Additional Feature 8

The method of manufacturing a semiconductor device set forth in the additional feature 1 is configured in such a manner that:

the first film deposition gas is a silane-based gas;
the second film deposition gas is a propylene ($C_3H_6$) gas;
the thin film is a silicon carbide film; and
in the thin film depositing step, a sediment chiefly made of silicon adheres to the interior of the supply portion and a sediment chiefly made of silicon and carbon adheres to the interior of the process chamber.

Additional Feature 9

The method of manufacturing a semiconductor device set forth in the additional feature 1 is configured in such a manner that:

the first film deposition gas is a silane-based gas;
the second film deposition gas is a propylene ($C_3H_6$) gas and an ammonia ($NH_3$) gas;
the thin film is a silicon carbonitride film; and
in the thin film depositing step, a sediment chiefly made of silicon adheres to the interior of the supply portion and a sediment chiefly made of silicon, carbon, and nitrogen adheres to the interior of the process chamber.

Additional Feature 10

The method of manufacturing a semiconductor device set forth in the additional feature 1 is configured in such a manner that:

the supply portion has plural nozzles having different lengths; and
in the thin film depositing step, the first film deposition gas is supplied from plural points inside the process chamber via the plural nozzles.

Additional Feature 11

The method of manufacturing a semiconductor device set forth in the additional feature 1 is configured in such a manner that, in the sediment removing step, end points of the cleaning inside the process chamber and the cleaning inside the supply portion are made to coincide with each other.

Additional Feature 12

The method of manufacturing a semiconductor device set forth in the additional feature 1 is configured in such a manner that the cleaning gas includes at least one gas selected from the group consisting of a nitrogen trifluoride ($NF_3$) gas, a chlorine trifluoride ($ClF_3$) gas, a fluorine ($F_2$) gas, a hydrogen fluoride (HF) gas, and a chlorine ($Cl_2$) gas.

Additional Feature 13

The method of manufacturing a semiconductor device set forth in the additional feature 1 is configured in such a manner that the cleaning gas is at least one gas selected from the group consisting of a nitrogen trifluoride ($NF_3$) gas, a chlorine trifluoride ($ClF_3$) gas, a fluorine ($F_2$) gas, a hydrogen fluoride (HF) gas, and a chlorine ($Cl_2$) gas diluted with at least one gas selected from the group consisting of a nitrogen ($N_2$) gas, an oxygen ($O_2$) gas, an argon (Ar) gas, and a helium (He) gas.

Additional Feature 14

The method of manufacturing a semiconductor device set forth in the additional feature 1 is configured in such a manner that, in the thin film depositing step, the thin film is deposited on the respective substrates while plural substrates are aligned spaced apart in multiple stages in an almost horizontal posture inside the process chamber.

Additional Feature 15

A method of manufacturing a semiconductor device, comprising the steps of:

carrying a substrate inside a process chamber;
depositing a silicon nitride film on the substrate by supplying a silane-based gas and an ammonia gas inside the process chamber;
carrying the substrate on which is deposited the silicon nitride film out from inside the process chamber; and
removing a first sediment adhering to an interior of the process chamber and a second sediment adhering to an interior of the supply portion and having a chemical composition different from a chemical composition of the first sediment by supplying cleaning gases inside the process chamber and inside a supply portion that supplies the first film deposition gas while changing at least one of a supply flow rate, a concentration, and a type between a cleaning gas to be supplied inside the process chamber and a cleaning gas to be supplied inside the supply portion.

Additional Feature 16

A substrate processing apparatus, comprising:

a process chamber in which processing to deposit a thin film on a substrate is performed;
a heating portion provided on an outside of the process chamber to heat inside the process chamber;
a first supply portion disposed in an area opposing the heating portion inside the process chamber at least in part to supply inside the process chamber a first film deposition gas including at least one element among plural elements forming the thin film to be deposited on the substrate and capable of accumulating a film solely;

a second supply portion to supply inside the process chamber a second film deposition gas including at least another element among the plural elements and incapable of accumulating a film solely;

a third supply portion that supplies a cleaning gas inside the process chamber;

an exhaust portion that exhausts atmosphere from inside the process chamber; and a controller that performs control so that cleaning gases are supplied inside the first supply portion and inside the process chamber from the third supply portion while changing at least one of a supply flow rate, a concentration, and a type between a cleaning gas to be supplied inside the first supply portion and a cleaning gas to be supplied inside the process chamber from the third supply portion for removing a first sediment adhering to an interior of the process chamber and a second sediment adhering to an interior of the first supply portion and having a chemical composition different from a chemical composition of the first sediment.

Additional Feature 17

The substrate processing set forth in the additional feature 16 is configured in such a manner that the second supply portion also serves as the third supply portion.

Additional Feature 18

The substrate processing apparatus set forth in the additional feature 16 is configured in such a manner that the first supply portion has plural nozzles having different lengths and supplies the first film deposition gas from plural positions within the process chamber.

INDUSTRIAL APPLICABILITY

The invention can be used for the method of manufacturing a semiconductor device and the substrate processing apparatus for processing semiconductor wafers and glass substrates that need cleaning inside the film deposition gas nozzles and inside the process chamber.

The invention claimed is:

1. A method of manufacturing a semiconductor device, comprising:

carrying a substrate into a process chamber;

depositing a thin film on the substrate by supplying inside the process chamber (a) through a first supply portion, a first film deposition gas including at least one element among plural elements composing the thin film to be deposited and capable of depositing a film by itself and (b) through a second supply portion a second film deposition gas including at least another element among the plural elements and incapable of depositing a film by itself, while heating an interior of the process chamber and an interior of the first supply portion at a same temperature at which the first film deposition gas undergoes heat decomposition;

carrying the substrate on which the thin film is deposited out from inside the process chamber; and removing a first deposit deposited on an interior surface of the process chamber and including the plural elements and a second deposit deposited on an interior surface of the first supply portion, including the at least one element and having a chemical composition different from a chemical composition of the first deposit, through etching reaction respectively, by supplying a cleaning gas inside the process chamber and inside the first supply portion while changing at least one of a supply flow rate, a concentration, and/or a material between a cleaning gas to be supplied inside the process chamber and a cleaning gas to be supplied inside the first supply portion, while heating the interior of the process chamber and the interior of the first supply portion at a same temperature.

2. The method of claim 1, wherein
the first film deposition gas includes a silicon-containing gas;
the second film deposition gas includes at least one of a nitrogen-containing gas, an oxygen-containing gas, and a carbon-containing gas;
the thin film includes silicon and at least one element among nitrogen, oxygen, and carbon; and
in the thin film depositing, a deposit chiefly made of silicon is deposited on the interior surface of the first supply portion and a deposit chiefly made of silicon and at least one element among nitrogen, oxygen, and carbon is deposited on the interior surface of the process chamber.

3. The method of claim 1, wherein
the first supply portion has plural nozzles; and
in the thin film depositing, the first film deposition gas is supplied from plural points inside the process chamber via the plural nozzles, while heating the interior of the process chamber and interiors of the plural nozzles at the same temperature at which the first film deposition gas undergoes heat decomposition.

4. The method of claim 1, wherein
in the deposits removing, end points of the cleaning inside the process chamber and the cleaning inside the first supply portion are made to coincide with each other.

5. The method of claim 1, wherein
the cleaning gas includes at least one gas selected from the group consisting of a nitrogen trifluoride gas, a chlorine trifluoride gas, a fluorine gas, a hydrogen fluoride gas, and a chlorine gas.

6. The method of claim 1, wherein
the cleaning gas is at least one gas selected from the group consisting of a nitrogen trifluoride gas, a chlorine trifluoride gas, a fluorine gas, a hydrogen fluoride gas, and a chlorine gas diluted with at least one gas selected from the group consisting of a nitrogen-containing gas, an oxygen-containing gas, and an inert gas.

7. The method of claim 1, wherein
in the thin film depositing, the thin film is deposited on each of plural substrates while the substrates are aligned at intervals in multiple stages in an almost horizontal posture inside the process chamber.

8. A method of manufacturing a semiconductor device, comprising:
carrying a substrate inside a process chamber;
depositing a thin film including silicon and nitrogen on the substrate by supplying a silane-based gas through a first supply portion and a nitrogen-containing gas through a second supply portion inside the process chamber, while heating an interior of the process chamber and an interior of the first supply portion at a same temperature at which the silane-based gas undergoes heat decomposition;
carrying the substrate on which the thin film is deposited out from inside the process chamber; and
removing a first deposit chiefly made of silicon and nitrogen and deposited on the interior of the process chamber and a second deposit chiefly made of silicon and deposited on the interior of the first supply portion through etching reaction respectively, by supplying a cleaning gas inside the process chamber and inside the first supply portion while changing at least one of a supply flow rate, a concentration, and/or a material between a cleaning gas to be supplied inside the process chamber and a cleaning gas to be supplied inside the first supply portion, while heating the interior of the process chamber and the interior of the first supply portion at a same temperature.

9. The method of claim 1, wherein
the first film deposition gas includes a silicon-containing gas;
the second film deposition gas includes nitrogen-containing gas,
the thin film includes silicon and nitrogen; and
in the thin film depositing, a deposit chiefly made of silicon is deposited on the interior surface of the first supply portion and a deposit chiefly made of silicon and nitrogen is deposited on the interior surface of the process chamber.

10. The method of claim 1, wherein
the first film deposition gas includes a silicon-containing gas;
the second film deposition gas includes an oxygen-containing gas,
the thin film includes silicon and oxygen; and
in the thin film depositing, a deposit chiefly made of silicon is deposited on the interior surface of the first supply portion and a deposit chiefly made of silicon and oxygen is deposited on the interior surface of the process chamber.

11. The method of claim 1, wherein
the first film deposition gas includes a silicon-containing gas;
the second film deposition gas includes a carbon-containing gas,
the thin film includes silicon and carbon; and
in the thin film depositing, a deposit chiefly made of silicon is deposited on the interior surface of the first supply portion and a deposit chiefly made of silicon and carbon is deposited on the interior surface of the process chamber.

12. The method of claim 1, wherein
the first film deposition gas includes a silicon-containing gas;
the second film deposition gas includes a nitrogen-containing gas and an oxygen-containing gas,
the thin film includes silicon, nitrogen and oxygen; and
in the thin film depositing, a deposit chiefly made of silicon is deposited on the interior surface of the first supply portion and a deposit chiefly made of silicon, nitrogen and oxygen is deposited on the interior surface of the process chamber.

13. The method of claim 1, wherein
the first film deposition gas includes a silicon-containing gas;
the second film deposition gas includes a nitrogen-containing gas and a carbon-containing gas,
the thin film includes silicon, nitrogen and carbon; and
in the thin film depositing, a deposit chiefly made of silicon is deposited on the interior surface of the first supply portion and a deposit chiefly made of silicon, nitrogen and carbon is deposited on the interior surface of the process chamber.

14. The method of claim 1, wherein
the first supply portion has at least one nozzle; and
in the thin film depositing, the first film deposition gas is supplied via the nozzle, while heating the interior of the process chamber and an interior of the nozzle at the same temperature at which the first film deposition gas undergoes heat decomposition.

15. A method of cleaning, comprising:
providing a process chamber in which a thin film is deposited on a substrate by supplying inside the process chamber (a) through a first supply portion, a first film deposition gas including at least one element among plural elements composing the thin film to be deposited and capable of depositing a film by itself and (b) through a second supply portion a second film deposition gas including at least another element among the plural elements and incapable of depositing a film by itself, while heating an interior of the process chamber and an interior of the first supply portion at a same temperature at which the first deposition gas undergoes heat decomposition;
removing a first deposit deposited on an interior surface of the process chamber and including the plural elements and a second deposit deposited on an interior surface of the first supply portion, including the at least one element and having a chemical composition different from a chemical composition of the first deposit, through etching reaction respectively, by supplying a cleaning gas inside the process chamber and inside the first supply portion while changing at least one of a supply flow rate, a concentration, and/or a material between a cleaning gas to be supplied inside the process chamber and a cleaning gas to be supplied inside the first supply portion, while heating the interior of the process chamber and the interior of the first supply portion at a same temperature.

16. The method of claim 1, wherein
during the step of removing the first deposit, a supply period of the cleaning gas to be supplied inside the process chamber is different from a supply period of the cleaning gas to be supplied inside the first supply portion.

17. The method of claim 1, wherein
during the step of removing the first deposit, a timing of a supply start or a supply stop between the cleaning gas to be supplied inside the process chamber and the cleaning gas to be supplied inside the first supply portion is different.

18. The method of claim 1, wherein
during the step of removing the first deposit, a first cleaning gas is supplied inside the process chamber as the cleaning gas and a second cleaning gas is supplied inside the first supply portion as the cleaning gas, the first cleaning gas being different from the second cleaning gas in material.

19. The method of claim 1, wherein
the first supply portion includes a plurality of nozzles; and
during the step of removing the first deposit, the cleaning gas is supplied inside the plurality of nozzles while changing at least one of a supply flow rate, a concentration, or a material between the cleaning gas to be supplied inside at least one nozzle among the plurality of nozzles and the cleaning gas to be supplied inside at least another nozzle among the plurality of nozzles, while heating the interior of the process chamber and interiors of the plurality of nozzles at a same temperature.

20. The method of claim 1, wherein
the first supply portion includes a plurality of nozzles; and
during the step of removing the first deposit, the cleaning gas is supplied inside the plurality of nozzles while changing a supply period between the cleaning gas to be supplied inside at least one nozzle among the plurality of nozzles and the cleaning gas to be supplied inside at least another nozzle among the plurality of nozzles, while heating the interior of the process chamber and interiors of the plurality of nozzles at a same temperature.

* * * * *